US008280706B2

(12) United States Patent
Ikeda et al.

(10) Patent No.: US 8,280,706 B2
(45) Date of Patent: Oct. 2, 2012

(54) DISTRIBUTED PROCESSING-TYPE SIMULATOR

(75) Inventors: Takuro Ikeda, Kawasaki (JP); Eiji Kitagawa, Kawasaki (JP); Hiroshi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 221 days.

(21) Appl. No.: 12/869,934

(22) Filed: Aug. 27, 2010

(65) Prior Publication Data
US 2011/0054874 A1 Mar. 3, 2011

(30) Foreign Application Priority Data

Aug. 28, 2009 (JP) ................................. 2009-198398

(51) Int. Cl.
*G06F 17/10* (2006.01)
*G06F 15/16* (2006.01)
(52) U.S. Cl. ................. 703/2; 703/6; 701/118; 709/202; 709/219; 709/226; 709/229
(58) Field of Classification Search .................. 703/2, 6, 703/13; 701/117–119; 709/201, 202, 204, 709/205, 217, 219; 711/170, E12.001, E12.002
See application file for complete search history.

(56) References Cited

U.S. PATENT DOCUMENTS

| | | | | |
|---|---|---|---|---|
| 6,292,830 B1 * | 9/2001 | Taylor et al. | .................. | 709/224 |
| 6,536,037 B1 * | 3/2003 | Guheen et al. | ................ | 717/151 |
| 6,571,282 B1 * | 5/2003 | Bowman-Amuah | .......... | 709/219 |
| 7,389,214 B1 * | 6/2008 | Yelich et al. | ...................... | 703/6 |
| 7,395,193 B1 * | 7/2008 | Yelich et al. | ...................... | 703/6 |
| 7,860,639 B2 * | 12/2010 | Yang | ............................. | 701/117 |
| 2008/0195360 A1 * | 8/2008 | Chiang et al. | ..................... | 703/2 |
| 2010/0312894 A1 * | 12/2010 | Awad et al. | .................... | 709/226 |

FOREIGN PATENT DOCUMENTS

| | | |
|---|---|---|
| JP | 2000-163685 | 6/2000 |
| JP | 2002-251129 | 9/2002 |
| JP | 2004-348462 | 12/2004 |
| JP | 2005-4676 | 1/2005 |
| JP | 2007-47972 | 2/2007 |

OTHER PUBLICATIONS

Currie et al, A New Approach to Evaluating On-Road Public Transport Priority Projects: Balancing the Demand for Limited Road-Space, Transportation, 2007, pp. 413-428.*

(Continued)

*Primary Examiner* — Russell Frejd
(74) *Attorney, Agent, or Firm* — Staas & Halsey LLP

(57) ABSTRACT

A simulator simulates the behavior of a plurality of agents existing in the virtual space. Each of a plurality of calculators, communicable with one another, includes a space allocation storage that stores space allocation information, a space allocation control part that updates the space allocation information, an allocation change candidate space extracting part that extracts a divided space to be a candidate for the allocation change, a communication amount estimating part that calculates an amount of communication or an amount of change in communication generated between calculators based on the number of agents, a space allocation change judging part that determines whether or not to allocate a divided space to another calculator based on the amount of communication or the amount of change in communication, and a space allocation change executing part that requests the space allocation control part and other calculators to change the space allocation.

11 Claims, 19 Drawing Sheets

OTHER PUBLICATIONS

Kazerani, A. Can Betweenness Centrality Explain Traffic Patterns, Google search, people.eng.unimelb.edu.au/winter/pubs/kazerani09centrality, 2009, pp. 1-9.*

Chen et al, Smoothing Vehicular Traffic Flow Using Vehicular-based Ad Hoc Networking & Computing Grid (VGRID), Proceedings of the IEEE ITSC 2006, Sep. 2006, pp. 349-354.*

Li et al, Cellular Automation Model for Railway Traffic, Journal of Computational Physics, vol. 209, Iss. 1, Oct. 2005, pp. 179-192.*

Yang et al, An Innovative Dynamic Bus Lane System and Its Simulation-based Performance Investigation, 2009, IEEE Intelligent Vehicles Symposium, 2009, pp. 105-110.*

Boyd et al, How to Run an Automated Transportation System, IEEE Transactions on Systems, Man and Cybernetics, vol. SMC-2, Iss. 3, 1972, pp. 331-341.*

\* cited by examiner

= (the number of vehicles in the divided spaces $(S_i, S_u, S_d, S_l)) \times D_u$ Amount of communication after the allocation change

| Divided space ID | Division range (southwest coordinates — northeast coordinates) | Calculator in charge |
|---|---|---|
| Su | (x1, y2) ~ (x1, y3) | PC1 |
| Sl | (x0, y1) ~ (x1, y2) | PC1 |
| Si | (x1, y1) ~ (x2, y2) | PC1 |
| Sr | (x2, y1) ~ (x3, y2) | PC2 |
| Sd | (x1, y0) ~ (x2, y1) | PC3 |
| ... | ... | ... |

| Agent ID | Positional coordinates | Speed | Vehicle type information | Amount of operation | Travel distance | Travel hour | Destination information | Driver characteristics |
|---|---|---|---|---|---|---|---|---|
| A1 | (xa1, ya1) | 60km | aaa | 0.5 | 10km | 30min | Sannomiya | Male, age 30 |
| A2 | (xa2, ya2) | 55km | bbb | 1.1 | 20km | 60min | Nishinomiya | Female, age 25 |
| .. | .. | .. | .. | .. | .. | .. | .. | .. |

FIG. 9

DISTRIBUTED PROCESSING-TYPE SIMULATOR

CROSS-REFERENCE TO RELATED APPLICATION

This application is based upon and claims the benefit of priority of the prior Japanese Patent Application No. 2009-198398 filed on Aug. 28, 2009, the entire contents of which is incorporated herein by reference.

FIELD

The disclosure of the present application relates to a distributed processing-type simulator realized by distributed processing using a plurality of calculators.

BACKGROUND

Conventionally, simulators have been designed to simulate the behavior of individual agents in a virtual environment. Here, examples of the agents include moving objects such as vehicles, motorcycles, bicycles, and pedestrians. As one example, a technique has been known that predicts traffic volumes and traffic jam occurrence states using a simulator that simulates the behavior of vehicles. Such a traffic flow simulator is capable of evaluating effects of traffic smoothness beforehand that will be obtained by traffic measures, such as infrastructure installation including road maintenance and ETC service, and therefore, is utilized as an effective tool for city planning. Further, there also is a traffic flow simulator capable of predicting an accident occurrence state by simulating recognition and judgment errors by drivers (for example, see Japanese Laid-open Patent Publication No. 2007-47972).

The traffic flow simulator reproduces a traffic state in a virtual space in the computer. Among the traffic flow simulators, a simulator that models the behavior of individual vehicles is called a microscopic traffic flow simulator, which is capable of simulating traffic flows in detail. For a large-scale simulation, a parallel distributed processing is performed using a plurality of calculator resources.

Generally, in the distributed processing in the traffic flow simulator, a space targeted for the simulation is divided to be allocated to a plurality of calculator resources, and each of the calculator resources simulates the behavior of vehicles existing in the divided space allocated to themselves. As the behavior of vehicles in the real world is determined in accordance with the surrounding circumstances (other vehicles, pedestrians, traffic signals, etc), it is necessary to refer to the surrounding circumstances (information of other vehicles, etc) for simulating the behavior of vehicles. When adjacent spaces are allocated to other calculator resources, this information should be obtained via communication.

There is a problem that an amount of communication generated between the calculator resources increases as the number of vehicles increases, which results in a decline in processing performance. Because of this, Japanese Laid-open Patent Publication No. 2005-4676 has been known as a technique that reduces the amount of communication between the calculator resources in the parallel distributed processing.

SUMMARY

A simulator according to one aspect of the present application is a simulator that simulates behaviors of a plurality of agents existing in a virtual space by distributed processing that uses a plurality of calculators communicable with one another, wherein at least two of the calculators are accessible to a space allocation storage that stores, as space allocation information, a division range of each of divided spaces in the virtual space and a calculator to which processing related to an agent existing in each of the divided spaces is allocated, the simulator including: an allocation change candidate space extracting part that refers to the space allocation storage so as to extract, as an allocation change candidate space, a divided space to be a candidate for an allocation change from among divided spaces whose one or more adjacent spaces are allocated to another of the calculators; a communication amount estimating part that calculates, when the allocation change candidate space is allocated to a calculator targeted for the allocation, an amount of communication or an amount of change in communication to be generated between the calculator targeted for the allocation and another of the calculators, based on the number of agents existing in the allocation change candidate space and an adjacent divided space thereof; and a space allocation change judging part that determines whether or not to allocate the allocation change candidate space to the calculator targeted for the allocation, based on the amount of communication or the amount of change in communication calculated in the communication amount estimating part.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 9 exemplifies agent information 26*c*.

DESCRIPTION OF EMBODIMENTS

Figure 1:
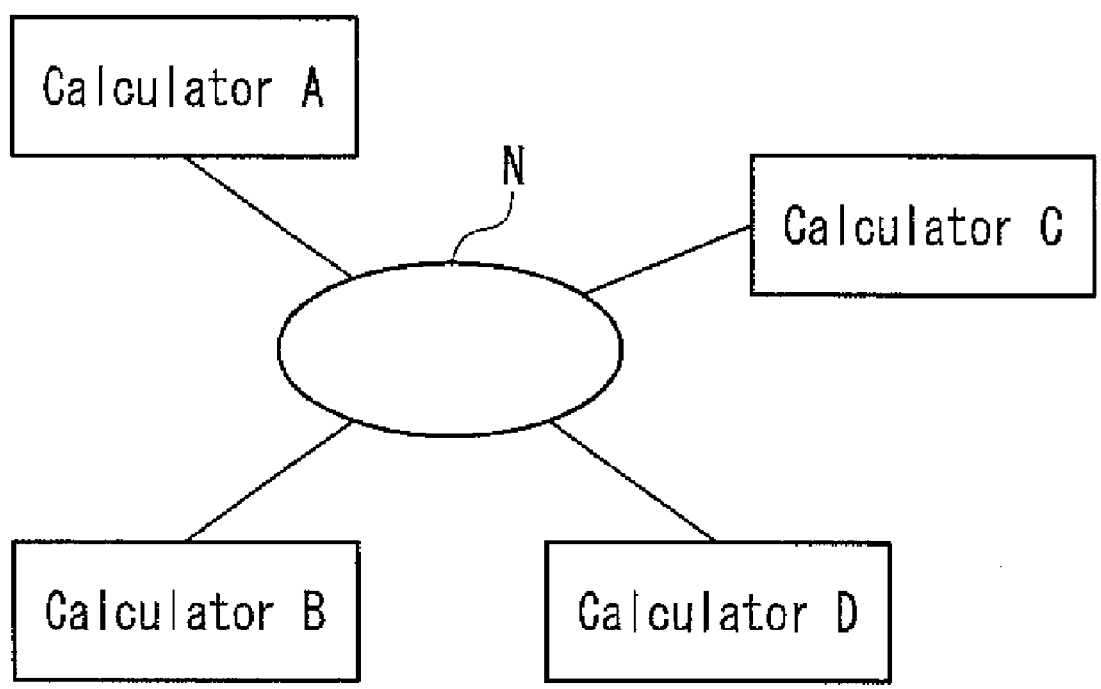
FIG. 1 exemplifies a configuration of a distributed processing-type simulator that includes calculators according to Embodiment 1.

The aforementioned Japanese Laid-open Patent Publication No. 2005-4676 discloses a configuration in which, in an environment where programs processed by a plurality of calculator resources operate in concert with one another, a calculator resource for processing the program is changed in accordance with a result obtained by comparing an amount of communication between a program in a certain calculator resource and another program in the calculator resource, and an amount of communication between a program in a certain calculator resource and a program in another calculator resource. This patent publication is aimed at reducing the amount of communication between calculators based on communication histories collected per program.

However, in the traffic flow simulation, since each agent has a complex behavior, it is necessary to perform communication between the calculator resources frequently in very short time intervals (several milliseconds). Because of this, when heavy-load processing, such as collecting communication histories, is performed, the performance of the simulator as a whole is decreased. Further, in the case of performing a large-scale simulation, the amount of communication increases as the number of vehicles increases, which further increases the processing load for collecting the communication histories.

A simulator according to one aspect of the present application is a simulator that simulates behaviors of a plurality of agents existing in a virtual space by distributed processing that uses a plurality of calculators communicable with one another, wherein at least two of the calculators are accessible to a space allocation storage that stores, as space allocation information, a division range of each of divided spaces in the virtual space and a calculator to which processing related to an agent existing in each of the divided spaces is allocated, the simulator including: an allocation change candidate space extracting part that refers to the space allocation storage so as to extract, as an allocation change candidate space, a divided space to be a candidate for an allocation change from among divided spaces whose one or more adjacent spaces are allocated to another of the calculators; a communication amount estimating part that calculates, when the allocation change candidate space is allocated to a calculator targeted for the allocation, an amount of communication or an amount of change in communication to be generated between the calculator targeted for the allocation and another of the calculators, based on the number of agents existing in the allocation change candidate space and an adjacent divided space thereof; and a space allocation change judging part that determines whether or not to allocate the allocation change candidate space to the calculator targeted for the allocation, based on the amount of communication or the amount of change in communication calculated in the communication amount estimating part.

According to the disclosure of the present application, in the distributed processing-type simulator, it is possible to drastically reduce the amount of communication between calculators.

Hereinafter, embodiments of the present application will be described specifically using the drawings.

1. Embodiment 1

A simulator according to the present embodiment is a traffic flow simulator that performs distributed processing by dividing a space so as to be allocated to a plurality of calculator resources. An agent in this case may be, for example, a moving object such as a vehicle, a pedestrian, or the like, and the present embodiment describes a case of setting a vehicle as an agent.

A traffic simulation according to the present embodiment, when it calculates the behavior of vehicles existing in a certain divided space, refers to information of vehicles existing in its adjacent spaces. When the adjacent spaces are allocated to other calculators, communication data is generated (communication data by reference). For example, when the data size of vehicle information to be referred to is fixed, the amount of communication to be generated is proportional to the number of vehicles existing in the adjacent spaces. In this case, based on the number of vehicles existing in a space "i" whose adjacent spaces are allocated to other calculators and the number of vehicles existing in the adjacent spaces, it is possible to calculate the current amount of communication and the amount of communication to be generated in the case where the allocation of the space i is changed. Incidentally, the "amount of communication" used herein refers to an amount of communication data to be generated between calculator resources, and is a concept that includes communication data between CPUs via a bus or communication data between computers via a network.

Based on the number of vehicles in the spaces, each calculator estimates amounts of communication to be generated when processing in a certain divided space allocated to itself is performed by other calculators to which the adjacent spaces are allocated. Then, by comparing respective amounts of communication estimated, the allocation of the divided spaces is changed between calculators. Since the amounts of communication are estimated from the number of vehicles existing in the spaces, communication histories are not required. Further, among a plurality of spaces allocated to its own calculator, the aforementioned processing only has to be performed in a space whose adjacent spaces are allocated to other calculator resources, whereby the amount of communication can be reduced without increasing the processing load.

1-1. System Configuration

FIG. 1 exemplifies a system configuration of a traffic flow simulator of a distributed processing-type in the present embodiment. In the example illustrated in FIG. 1, a plurality of calculators A to D are connected with one another via a network N. The calculators A to D are capable of simulating the behavior of a plurality of agents existing in a virtual space by the distributed processing. Each of the calculators A to D is independent hardware at least including a processor, a memory, and a communication interface. Incidentally, the plurality of calculators realizing the distributed processing are not necessarily independent calculators. For example, in a multiprocessor computer including a plurality of CPUs, the distributed processing may be realized by allowing each CPU to function together with a plurality of calculators. In other words, as long as respective calculators perform data communication with one another and serve individually as a resource for performing data processing, they are not limited to a specific configuration. Further, the number of calculators is not limited to the example illustrated in FIG. 1.

Each of the calculators A to D is allocated with a target area in the virtual space, and serves as a simulator that simulates the behavior of agents in the allocated target area. That is, each of the calculators A to D functions as a traffic flow simulator that realizes the simulation of the behavior of a plurality of vehicle agents existing in the virtual space by the distributed processing that uses a plurality of calculators.

Figure 2A:
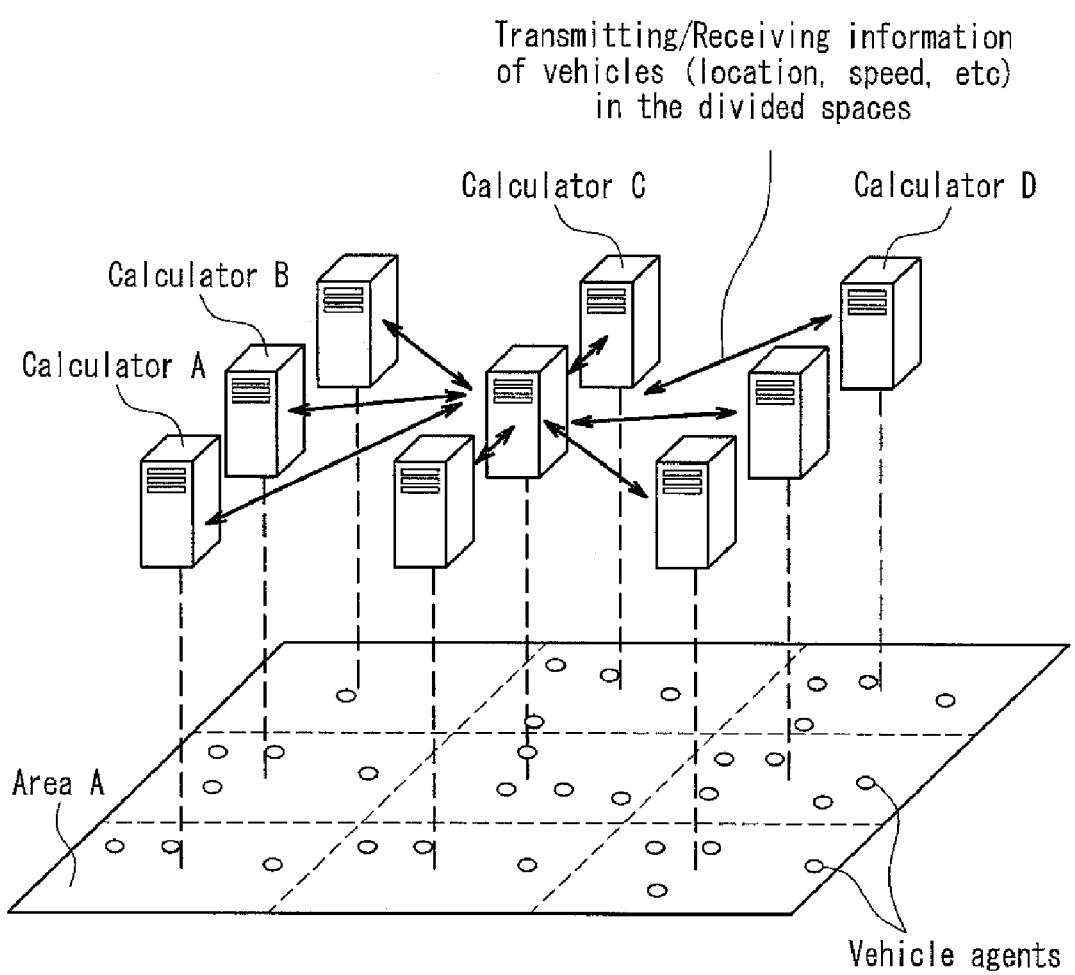
FIG. 2A exemplifies a schematic diagram illustrating a case where each calculator illustrated in FIG. 1 is allocated with a predetermined area in the virtual space, so as to simulate the behavior of a plurality of agents.

FIG. 2A exemplifies a schematic diagram illustrating a case where each calculator illustrated in FIG. 1 is allocated with a predetermined area in the virtual space, so as to simulate the behavior of a plurality of agents. In the example illustrated in FIG. 2A, the plurality of calculators including the calculators A to D are configured to be connectable with one another; perform processing to simulate the behavior of vehicle agents in the space areas allocated to themselves; and transmit/receive information of the vehicle agents (location, speed, etc) with other calculators. For example, the calculator A performs processing to simulate the behavior of respective vehicle agents existing in an allocated area A, and exchanges information of the respective vehicle agents (location, speed, etc) with other calculators (calculator B, etc).

Figure 2B:
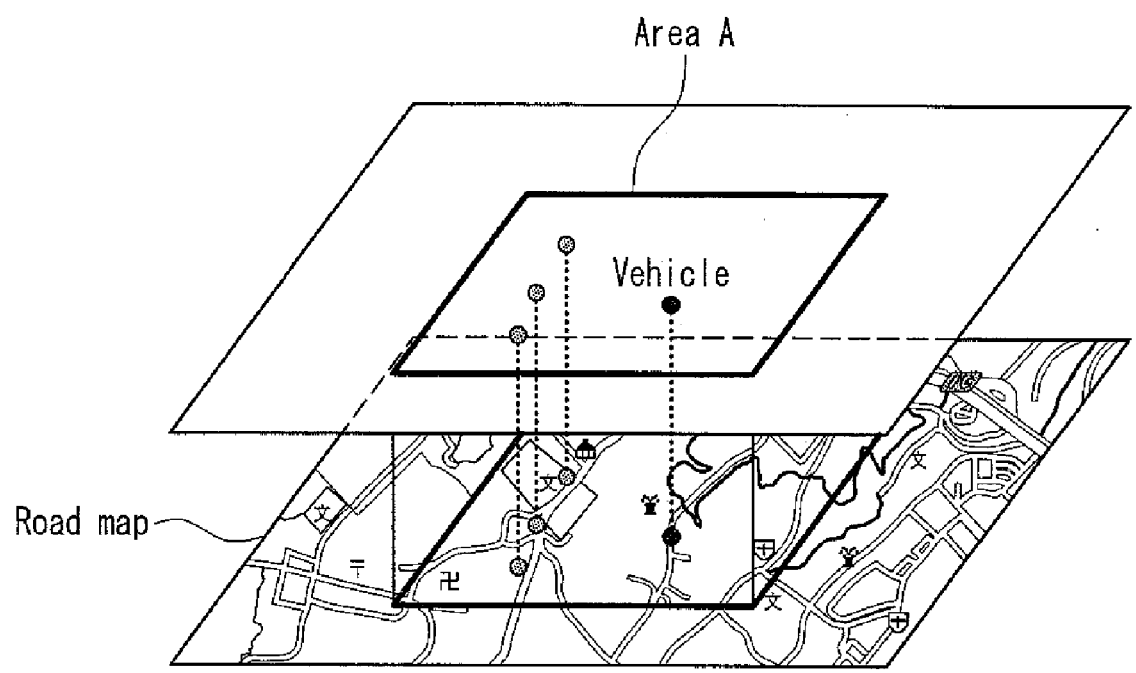
FIG. 2B exemplifies a schematic diagram illustrating a relationship between vehicle agents and a road map in the predetermined area illustrated in FIG. 2A.

FIG. 2B exemplifies a schematic diagram illustrating the relationship between agents and a road map in a predetermined area (for example, the area A) illustrated in FIG. 2A. For example, the behaviors of vehicle agents existing in the area A are simulated when moving on roads on the map.

At least one calculator is accessible to a space allocation storage that stores, as space allocation information, division ranges of respective divided spaces in the virtual space and calculators to which processing related to agents existing the respective divided spaces are allocated beforehand. Further, this calculator refers to the space allocation storage so as to extract, as an allocation change candidate space, a divided space to be a candidate for the allocation change from among the divided spaces whose one or more adjacent spaces are allocated to other calculators. This calculator calculates the amount of communication or the amount of change in communication to be generated between a calculator targeted for the allocation and other calculators when the allocation change candidate space is allocated to the calculator targeted for the allocation, based on the number of agents existing in the allocation change candidate space and its adjacent spaces. This calculator determines, based on the amount of communication or the amount of change in communication calculated, whether or not to allocate the allocation change candidate space to the calculator targeted for the allocation. This calculator includes a space allocation control part that updates the space allocation information stored in the space allocation storage. This calculator, in accordance with the above determination, requests its space allocation control part and the space allocation control part of the calculator targeted for the allocation to update the space allocation information.

Specifically, this calculator calculates, as an amount of communication before the allocation change, an amount of communication currently being generated between the allocation change candidate space and divided spaces of other calculators, and also calculates, as an amount of communication after the allocation change, an amount of communication expected to be generated between the allocation change candidate space and divided spaces of the calculators other than the calculator targeted for the allocation when the allocation change candidate space is allocated to the calculator targeted for the allocation. Then, when the amount of communication after the allocation change is smaller than the amount of communication before the allocation change, this calculator determines to allocate the allocation change candidate space to the calculator targeted for the allocation.

Since the simulator according to the present embodiment calculates the amount of communication to be generated between adjacent spaces based on the number of vehicles, it is possible to suppress the increment of new processing load compared with conventional simulators. Therefore, also in the traffic flow simulator performing communication highly frequently, it is possible to reduce the amount of communication between calculator resources (network load).

For example, in the traffic flow simulator that performs the distributed processing, in order not to increase the amount of communication between calculator resources, it is necessary to allocate spaces where vehicles exist concentratedly to one calculator resource. However, in the traffic simulation targeting wide areas such as major cities, it requires huge costs to find such spaces by hand and allocate them to the one calculator resource. Further, the traffic state changes momentarily, which actually makes it impossible to do such operations by hand.

On the contrary, the simulator according to the present embodiment can combine scalability with respect to the increment in space targeted for the simulation and flexibility with respect to the change in the traffic state attributed to the dynamic space allocation.

1-2. Functional Block Diagram

Figure 3:
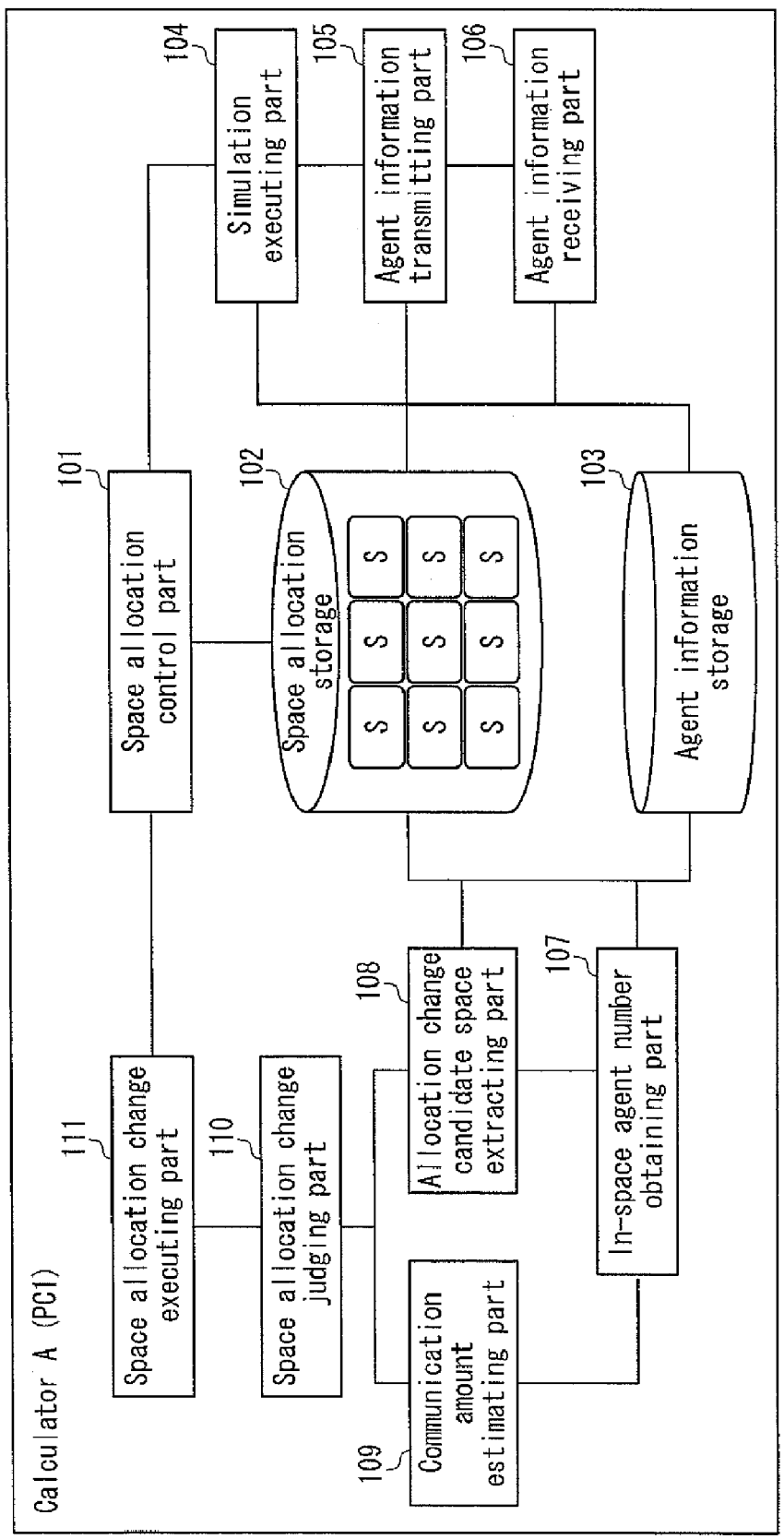
FIG. 3 exemplifies a functional block diagram illustrating a configuration example of a calculator A illustrated in FIG. 1.

FIG. 3 exemplifies a functional block diagram of the calculator A (the identification ID is referred to as "PC 1") illustrated in FIG. 1. The other calculators, B to D or the like, may have the same configuration as the calculator A. Incidentally, it is preferable that the number of other calculators having the same configuration as the calculator A is one or more. It also is possible that only the calculator A has a configuration described below.

In the example illustrated in FIG. 3, the calculator A includes a space allocation control part 101, a space allocation storage 102, an agent information storage 103, a simulation executing part 104, an agent information transmitting part 105, an agent information receiving part 106, an in-space agent number obtaining part 107, an allocation change candidate space extracting part 108, a communication amount estimating part 109, a space allocation change judging part 110, and a space allocation change executing part 111.

The space allocation storage 102 stores the space allocation information that indicates division ranges of respective divided spaces in the virtual space and calculators allocated to the respective divided spaces. The space allocation control part 101 updates the space allocation information stored in the space allocation control part. The agent information storage 103 stores agent information at least containing information of the location of agents.

The simulation executing part 104 refers to map information of the target area allocated to the calculator A (PC 1) in the virtual space, the agent information at least containing the information of the location of agents, and area allocation information indicating the areas allocated to other calculators, so as to simulate the behavior of respective agents in the target area of the calculator A; and repeats the processing of updating the agent information of the respective agents. The agent information transmitting part 105 transmits the agent information to other calculator resources. The agent information receiving part 106 receives the agent information from other calculator resources.

The in-space agent number obtaining part 107 refers to ranges of the divided spaces and locations of agents so as to obtain the number of agents existing in the respective divided spaces. The allocation change candidate space extracting part 108 extracts a divided space to be a candidate for the allocation change from among the divided spaces whose adjacent spaces are allocated to other calculators. The communication amount estimating part 109 calculates, based on the number of agents, the amount of communication between a certain divided space and its adjacent spaces. The space allocation change judging part 110 compares an amount of communication under the current allocation and an amount of communication at the time of the allocation change of the allocation change candidate space, and if the amount of communication is smaller after the allocation change, it determines to change the allocation. The space allocation change executing part 111 requests the space allocation control parts of all the calculators to change the space allocation, and also requests the agent information transmitting part 105 to transmit the agent information in the space subject to the allocation change to the calculator of the allocation change destination.

Incidentally, each functional part of the calculator A illustrated in FIG. 3 is a concept including functions of a CPU realized by a program. Here, the program is a concept including not only a program directly executable by the CPU, but also programs such as a source-format program, compressed program, encrypted program, and the like. Further, a program for realizing the above functions by a computer or a recording medium with such a computer program recorded thereon also is within the scope of one embodiment of the present invention. The foregoing recording medium includes a non-transitory recording medium that is not directed to purely a signal.

1-3. Hardware Configuration of the Calculator

Figure 4:
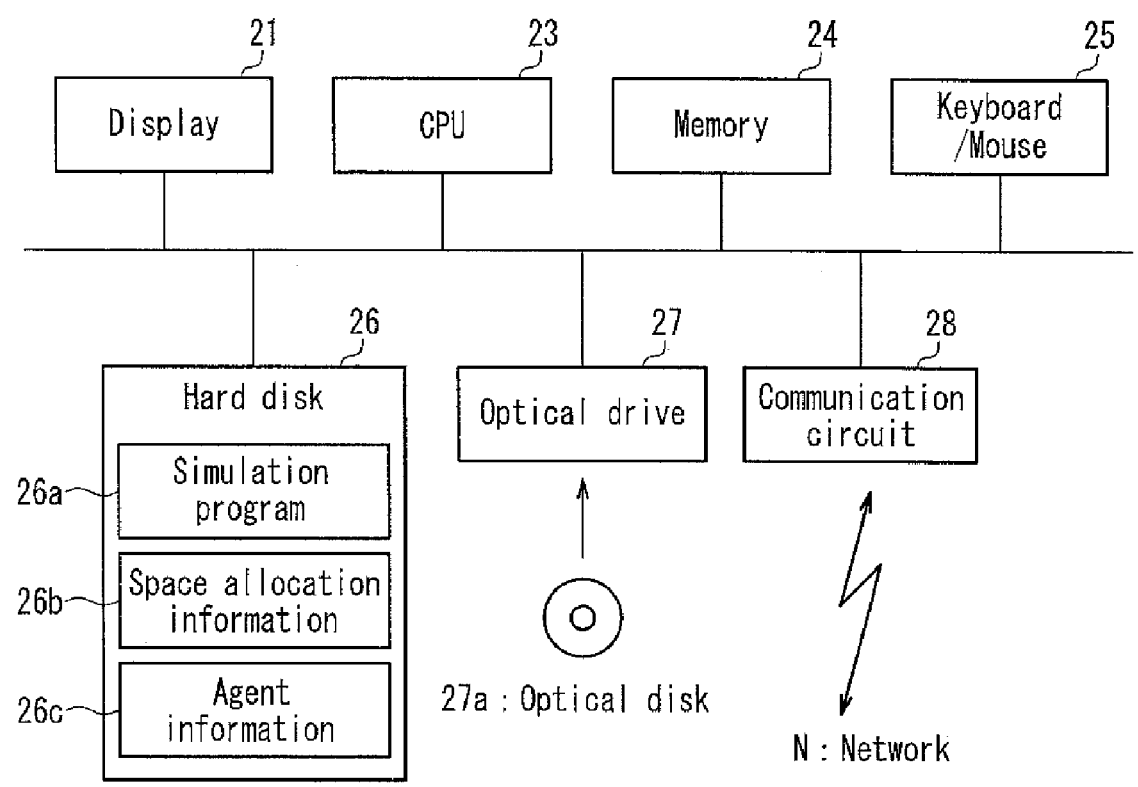
FIG. 4 exemplifies a hardware configuration in which the calculators illustrated in FIGS. 1 to 3 are realized using a CPU.

FIG. 4 exemplifies a hardware configuration in which the calculators illustrated in FIGS. 1 to 3 are realized using CPUs. The above-described calculator includes a display 21, a CPU 23, a memory 24, a keyboard/mouse 25, a hard disk 26, an optical drive 27, and a communication circuit 28. Incidentally, the display 21, the keyboard/mouse 25 and/or the optical drive 27 may be present in any one of the calculators constituting the simulator.

An OS (operating system, not illustrated), a simulation program 26a, space allocation information 26b, agent information 26c and the like are recorded on the hard disk 26. It also is possible to have a configuration in which all of or some from the operating system (OS) (not illustrated), the simulation program 26a, the space allocation information 26b, the agent information 26c and the like are recorded on the memory 24.

The simulation program 26a is installed by, for example, reading out a program recorded on the optical disk 27a such as a CD-ROM via the optical drive 27. It also is possible to perform the aforementioned installation by downloading a program recorded on a server device or the like via the network N using the communication circuit 28. The CPU 23 performs processing based on the OS, the simulation program 26a, and the like. Although, in the present embodiment, execution results of the simulation are not saved, but they may be saved to be displayed later.

The space allocation storage 102 and the agent information storage 103 that are constituting the calculator A illustrated in FIG. 3 correspond to the space allocation information 26b and the agent information 26c that are recorded on the hard disk 26, respectively. Some of the parts constituting the calculator A illustrated in FIG. 3, which are the space allocation control part 101, simulation executing part 104, agent information transmitting part 105, agent information receiving part 106, in-space agent number obtaining part 107, allocation change candidate space extracting part 108, communication amount estimating part 109, space allocation change judging part 110 and the space allocation change executing part 111, are realized by executing the simulation program 26a on the CPU 23.

1-4. Outline of the Processing

Figure 5A:
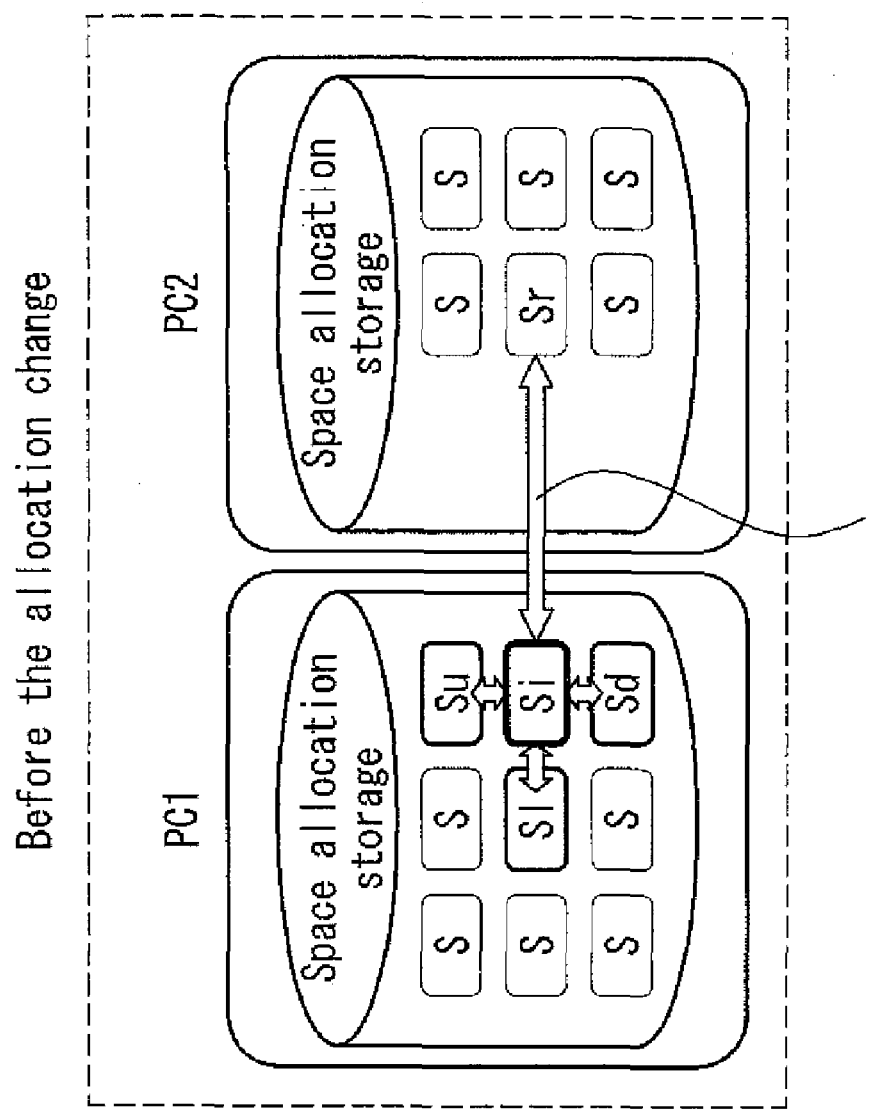
FIGS. 5A and 5B schematically illustrate communication states before and after the allocation of an allocation change candidate space is changed from the calculator PC 1 to the calculator PC 2.
Figure 5B:
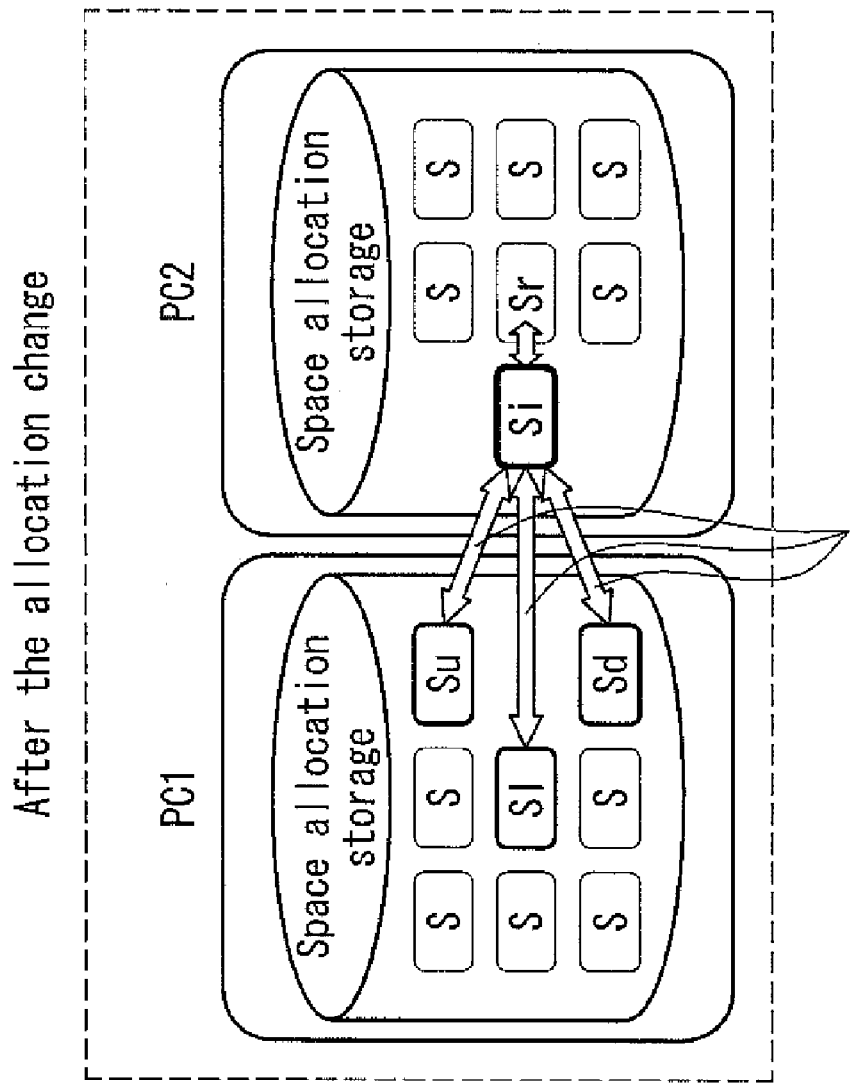

FIGS. 5A and 5B schematically illustrate communication states before and after the allocation of an allocation change candidate space is changed from a calculator PC 1 to a calculator PC 2. As illustrated in FIG. 5A, an allocation change candidate space Si before the allocation change in the calculator PC 1 communicates with a divided space Sr in the PC 2. Therefore, the amount of communication before the allocation change between the calculators PC 1 and PC 2 can be represented by, for example, the following formula:

Amount of communication before the allocation change=(the number of vehicles existing in the divided spaces $(Si, Sr)$)×$Du$ Here, Du is the amount of data required for communication per vehicle.

When the allocation change candidate space Si in the calculator PC 1 is moved to the PC 2, the allocation change candidate space Si in the calculator PC 2 communicates with the divided spaces Su, Sl and Sd in the PC 1, as illustrated in FIG. 5B. Therefore, the amount of communication after the allocation change between the calculators PC 1 and PC 2 is represented by the following formula:

Amount of communication after the allocation change=(the number of vehicles existing in the divided spaces $(Si, Su, Sd, Sl)$)×$Du$ Therefore, when the amount of communication after the allocation change, i.e., the amount of communication between the calculators PC 1 and PC 2 that is related to the allocation change candidate space Si in the case where the allocation change candidate space Si in the PC 1 is moved to the PC 2, is smaller than the amount of communication before the allocation change, i.e., the amount of communication between the calculators PC 1 and PC 2 that is related to the allocation change candidate space Si before the space Si is moved to the PC 2, the amount of communication between these calculators is expected to be reduced.

1-5. Processing Contents of the Simulation Program

Processing contents of the simulation program in the aforementioned calculators will be described using FIGS. 6 to 10.

Figure 6:
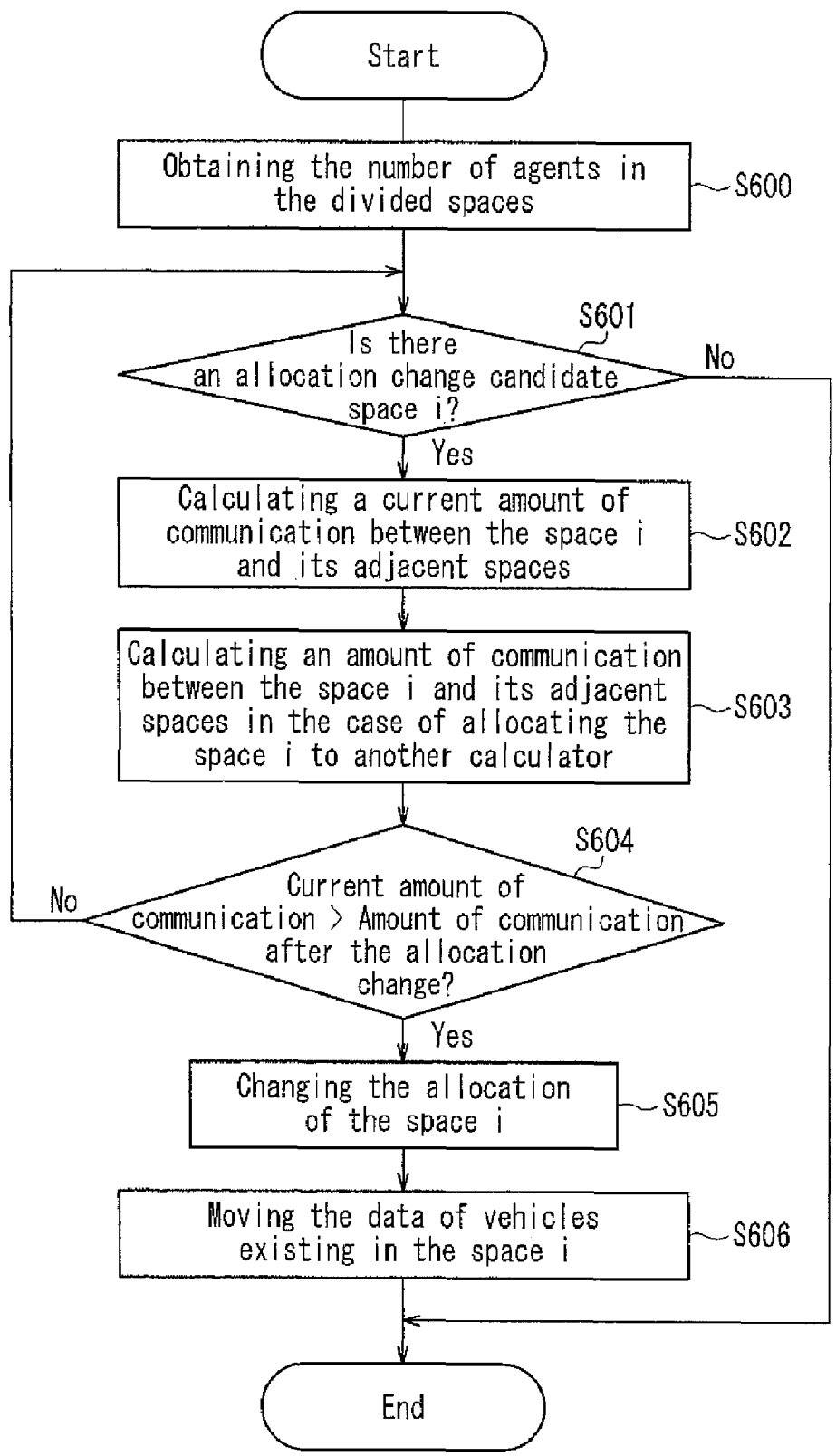
FIG. 6 exemplifies an operation chart illustrating processings based on a simulation program executed in a CPU 23 of the calculator.
Figures 7, 8:
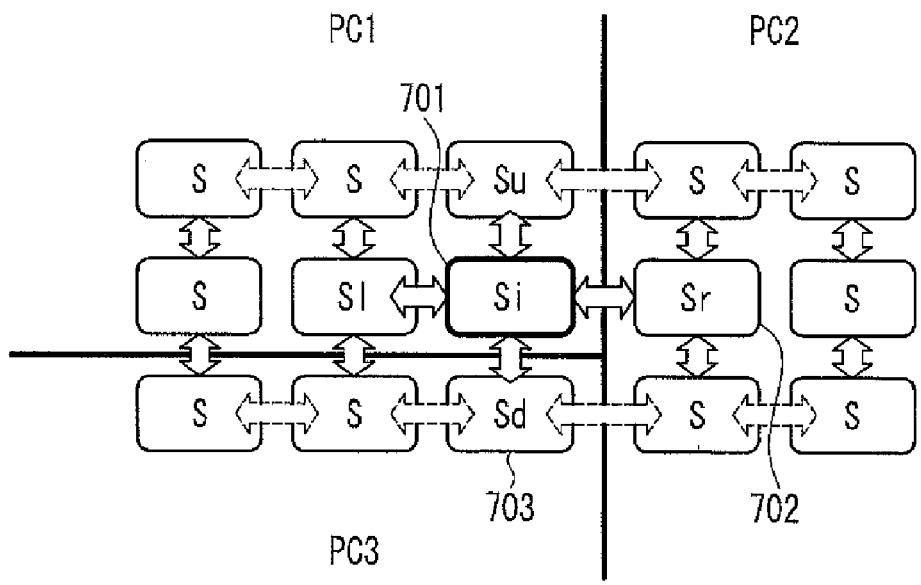
FIG. 7 exemplifies a plurality of the divided spaces allocated to a part of the calculators (PC 1 to PC 3) constituting the simulator.
FIG. 8 exemplifies space allocation information 26*b*.
Figure 10:
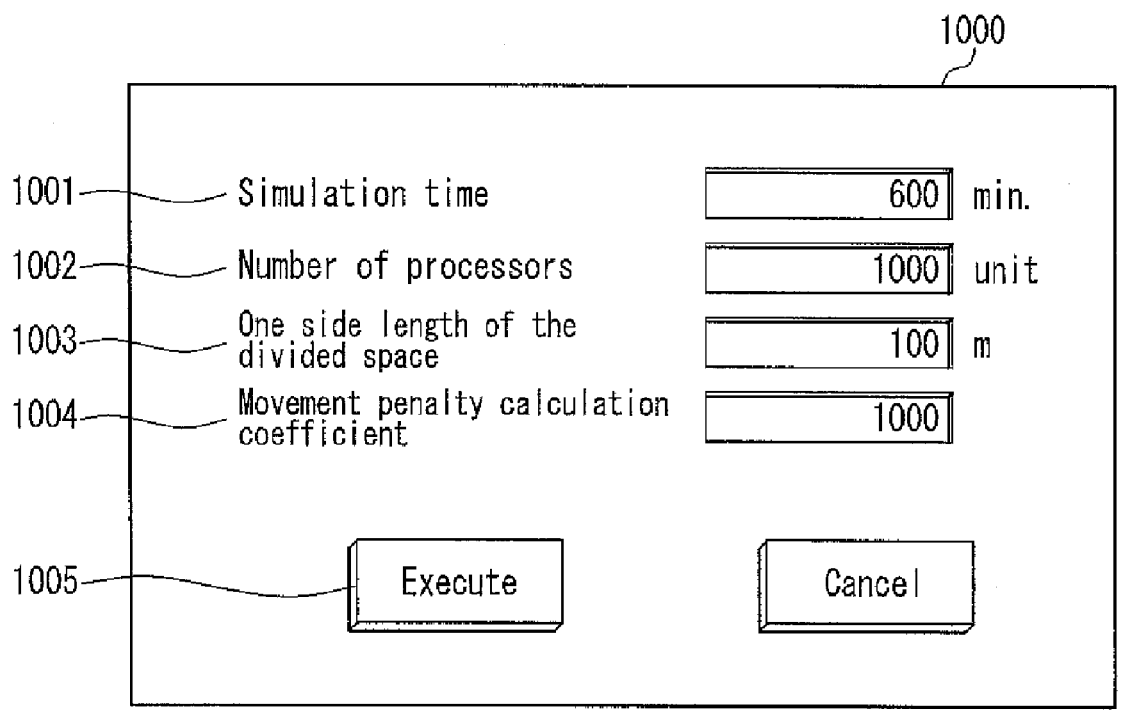
FIG. 10 exemplifies a control screen for giving simulation criteria to the simulator at the time of executing the simulation program.

FIG. 6 exemplifies an operation chart illustrating processings based on a simulation program executed in the CPU 23 of the calculator. FIG. 7 exemplifies a plurality of divided spaces allocated to a part of the calculators (PC 1 to PC 3) constituting the traffic flow simulator according to the present embodiment. FIG. 8 exemplifies the space allocation information 26b. FIG. 9 exemplifies the agent information 26c. FIG. 10 exemplifies a control screen for giving simulation criteria to the simulator at the time of executing the simulation program.

Incidentally, a control screen 1000 illustrated in FIG. 10 is not particularly limited as long as the control screen is displayed on the display 21 of any one of the calculators on the network N and is controlled using the keyboard/mouse 25 of any one of the calculators. The simulation criteria input in the control screen can be referred to by the simulation programs of the respective calculators.

Here, a processing for reducing the amount of communication to be generated between calculators when a divided space allocated to the calculator PC 1, PC 2 or PC 3 illustrated in FIG. 7 is adjacent to divided spaces allocated to other calculators will be described. As indicated in the control screen 1000 in FIG. 10, the following are criteria for the traffic flow simulation of the present embodiment: a simulation time 1001 indicating a time of executing simulation "600 min"; the number of processors 1002 indicating the number of calculators "1000 units"; one side length of the divided space 1003 indicating an area size corresponding to the road map "100 m"; a movement penalty calculation coefficient 1004 indicating the degree of increase in the amount of communication in accordance with the movement of vehicles "1000". The movement penalty calculation coefficient 1004 will be described in another embodiment.

The CPU 23 of the calculator PC 1 executing the simulation program refers to the space allocation information 26b (FIG. 8) and the agent information 26c (FIG. 9) in the hard disk 26 for obtaining the number of vehicle agents existing in each divided space (operation S600). For example, as illustrated in FIG. 7, as an example in the present embodiment, each divided space has a substantially rectangular shape. Therefore, as illustrated in FIG. 8, a division range 802 for specifying a divided space identified using a divided space ID 801 is expressed by coordinates of two opposite angles in the rectangular shape (for example, southwest coordinates and northeast coordinates on the map).

The CPU 23 refers to the agent information 26c (FIG. 9) and obtains the number of vehicle agents existing in each divided space, based on whether or not positional coordinates 902 of each vehicle agent identified using an agent ID 901 are in the division range 802 (FIG. 8) of each divided space.

The CPU 23 refers to the space allocation information 26b in the hard disk 26, and judges whether or not there is an allocation change candidate space i (operation S601). For example, in the space allocation information 26b illustrated in FIG. 8, the CPU 23 extracts divided space IDs "Su", "Sl" and "Si whose calculators in charge 803 have its own calculator ID of "PC 1". Then, based on whether or not a part of the coordinates of the extracted divided spaces (hereinafter, referred to as divided spaces Su, Sl, Si, . . . ) matches the coordinates in the division ranges 802 described above, the CPU 23 extracts an ID of the divided space whose adjacent spaces are allocated to another calculators (PC 2 or PC 3). For example, in FIG. 7, the CPU 23 extracts divided spaces Sr 702 and Sd 703 as adjacent spaces of a divided space Si 701.

Here, as an example, based on whether or not the number of vehicle agents in each extracted divided space is equal to or greater than a predetermined threshold value, the CPU 23 judges whether or not to set the extracted divided spaces as an allocation change candidate space i. This is because as the number of vehicle agents increases, it is highly possible that the amount of communication is generated more. Therefore, changing the allocation of the divided spaces is expected to reduce the amount of communication between calculators effectively.

For example, when the number of vehicle agents in the divided space Si is equal to or greater than the predetermined threshold value, the divided space Si can be set as the allocation change candidate space i. Further, when the number of vehicle agents in the adjacent space Sr is equal to or greater than the predetermined threshold value, the divided space Si may be set as the allocation change candidate space i. Furthermore, when the sum of the number of vehicle agents in the divided space Si and in the adjacent space Sr is equal to or greater than the predetermined threshold value, the divided space Si may be set as the allocation change candidate space i. In addition, when the sum of the number of vehicle agents in the divided space Si and in the adjacent space Sr is equal to or greater than the predetermined threshold value, and at the same time, the number of vehicle agents in the divided space Si is less than that in the adjacent space Sr, the divided space Si may be set as the allocation change candidate space i. Incidentally, criteria for judging the allocation change candidate space i based on the number of vehicle agents in each extracted divided space are not limited to the above, and may be determined arbitrarily depending upon the behavior tendency of the agent, simulation criteria, and the like.

The CPU 23 calculates a current amount of communication between the allocation change candidate space i and its adjacent spaces (operation S602). An example of calculating the amount of communication will be described below. For example, Nx is "the number of vehicles existing in a divided space Sx", Dr is "the amount of data of vehicles (reference)", Du is "Dr×reference frequency per unit time". Incidentally, the "reference" used herein refers to communication of information (location, speed, etc) related to vehicle agents existing in the divided spaces allocated to other calculators. This communication is performed between calculators constantly.

As to the current amount of communication, an amount of communication D1 in which the divided space Si is processed by the PC 1 can be calculated by, for example, the following formula:

$$D1=(Ni\times 2+Nr+Nd)\times Du$$

Here, "Ni×2" reflects communication between the PC 1 and PC 2, and communication between the PC 1 and PC 3.

The CPU 23 calculates an amount of communication between the allocation change candidate space i and its adjacent spaces in the case of allocating the allocation change candidate space i to another calculator (operation S603).

An amount of communication D2 in which the allocation change candidate space i currently in the PC 1 is allocated to another calculator PC 2 and the divided space Si is processed by the PC 2 can be calculated by the following formula:

$$D2=(Ni\times 2+Nu+Nl+Nd)\times Du$$

Here, "Ni×2" reflects communication between the PC 2 and PC 1, and communication between the PC 2 and PC 3.

Similarly, an amount of communication D3 in which the allocation change candidate space i is allocated to another calculator PC 3 and the divided space Si is processed by the PC 3 can be calculated by the following formula:

$$D3=(Ni\times 2+Nu+Nl+Nr)\times Du$$

Here, "Ni×2" reflects communication between the PC 3 and PC 1, and communication between the PC 3 and PC 2.

The CPU 23 judges whether or not the amount of communication after the allocation change becomes smaller than the current amount of communication (amount of communication before the allocation change) (operation S604). For example, in the formulas above, when Ni=20, Nu=1, Nl=1, Nr=10, Nd=5; it is possible to calculate each of D1, D2 and D3 as follows:

$$D1=55 \times Du, D2=47 \times Du, D3=52 \times Du$$

In this case, since Du is a fixed value, D2 can be judged as the smallest value, which means that the amount of communication after the allocation change D2 becomes smaller than the current amount of communication D1 (amount of communication before the allocation change).

On the other hand, when Ni=20, Nu=8, Nl=7, Nr=10, Nd=5; it is possible to calculate each of D1, D2 and D3 as follows:

$$D1=55 \times Du, D2=60 \times Du, D3=65 \times Du$$

In this case, since Du is a fixed value, D1 can be judged as the smallest value, which means that the amounts of communication after the allocation change D2 and D3 do not become smaller than the current amount of communication D1 (amount of communication before the allocation change).

When judging that the amount of communication after the allocation change may become smaller than the current amount of communication (amount of communication before the allocation change) (operation S604, Yes), the CPU 23 changes the allocation of the allocation change candidate space i (operation S605). Specifically, in the space allocation information 26b (FIG. 8), the CPU 23 updates the ID of the calculator in charge of the allocation change candidate space i to the ID of the calculator of the allocation destination. Further, CPU 23 requests all the calculators including the calculator of the allocation destination to update the ID of the calculator in charge of the allocation change candidate space i in the space allocation information 26b to the ID of the calculator of the allocation destination.

As to the allocation change candidate space Si for example, in the space allocation information 26b (FIG. 8), when the allocation is changed from the PC 1 to PC 2, the CPU 23 updates the ID of the calculator in charge of the allocation change candidate space Si "PC 1" to the ID of the calculator of the allocation destination "PC 2", and requests all the calculators (PC 2, PC 3, . . . ) on the network N to perform the same update.

The CPU 23 moves the data of vehicle agents existing in the allocation change candidate space Si (operation S606). Specifically, the CPU 23 extracts data of each vehicle agent existing in the allocation change candidate space Si from the agent information 26c (FIG. 9), and transmits it to the calculator of the allocation destination. For example, when a vehicle agent having the agent ID 901 of "A2" exists in the allocation change candidate space Si, the CPU 23 transmits the data of the agent ID 901 "A2" (positional coordinates 902, speed 903, vehicle type information 904, amount of operation 905, travel distance 906, travel hour 907, destination information 908, driver characteristics 909, etc.) recorded in the agent information 26c to the calculator PC 2.

After receiving this transmission, the calculator PC 2 of the allocation change destination records the data of the agent ID 901 "A2" in the agent information 26c recorded on the hard disk 26 of the calculator PC 2. Thus, it is possible to simulate the behavior of vehicle agents existing in the allocation change candidate space Si even after the allocation is changed from the calculators PC 1 to PC 2. Further, since the amount of communication between the calculators PC 1 and PC 2 after the allocation change of the allocation change candidate space Si is smaller than the amount of communication before the allocation change, it is possible to reduce the amount of communication related to the allocation change candidate space Si.

The "allocation change candidate space extracting part" illustrated in the functional block diagram of FIG. 3 includes, as an example, processing functions at the operations S600 and S601 in FIG. 6. The "communication amount estimating part" includes, as an example, processing functions at the operations S602 and S603 in FIG. 6. The "space allocation change judging part" includes, as an example, a processing function at the operation S604 in FIG. 6. The "space allocation control part" includes, as an example, a processing function at the operation S605 in FIG. 6. The "space allocation change executing part" includes, as an example, a processing function at the operation S606 in FIG. 6.

2. Embodiment 2

A calculator of a simulator according to the present embodiment calculates an amount of change in communication in the case of moving the allocation change candidate space to the calculator targeted for the allocation, considering an amount of communication currently being generated between the adjacent spaces that are adjacent to the allocation change candidate space and allocated to its own calculator, and the divided space of the calculator targeted for the allocation, so as to judge whether or not the amount of communication as a whole between calculators can be reduced. Thus, by considering not only the allocation change candidate space but also considering with which calculator the adjacent spaces are communicating, it is possible to change the space allocation for reducing the total amount of communication. In other words, in the case of calculating the amount of communication to be generated between the adjacent spaces based on the number of vehicles, and judging whether or not the amount of communication is reduced, it is possible to consider substantial change in the amount of communication to be generated between the calculators.

2-1. Outline of the Processing

The followings are the same as FIGS. 1 to 4 respectively described in Embodiment 1: a configuration of a distributed processing-type simulator according to the present embodiment; a schematic diagram illustrating a case in which predetermined areas in the virtual space are allocated to respective calculators of the present embodiment, so as to simulate the behavior of a plurality of agents; a schematic diagram illustrating a relationship between vehicle agents and a road map in a predetermined area of the present embodiment; a functional block diagram illustrating a configuration example of a calculator of the present embodiment; and a hardware configuration in which the calculator is realized using a CPU. In the present embodiment, likewise Embodiment 1, an example of performing distributed processing using a calculator A (PC 1), calculator B (PC 2) and calculator C (PC 3) will be described. An initial allocation state of the divided spaces targeted for the simulation is the same as that of Embodiment 1.

Figure 11:
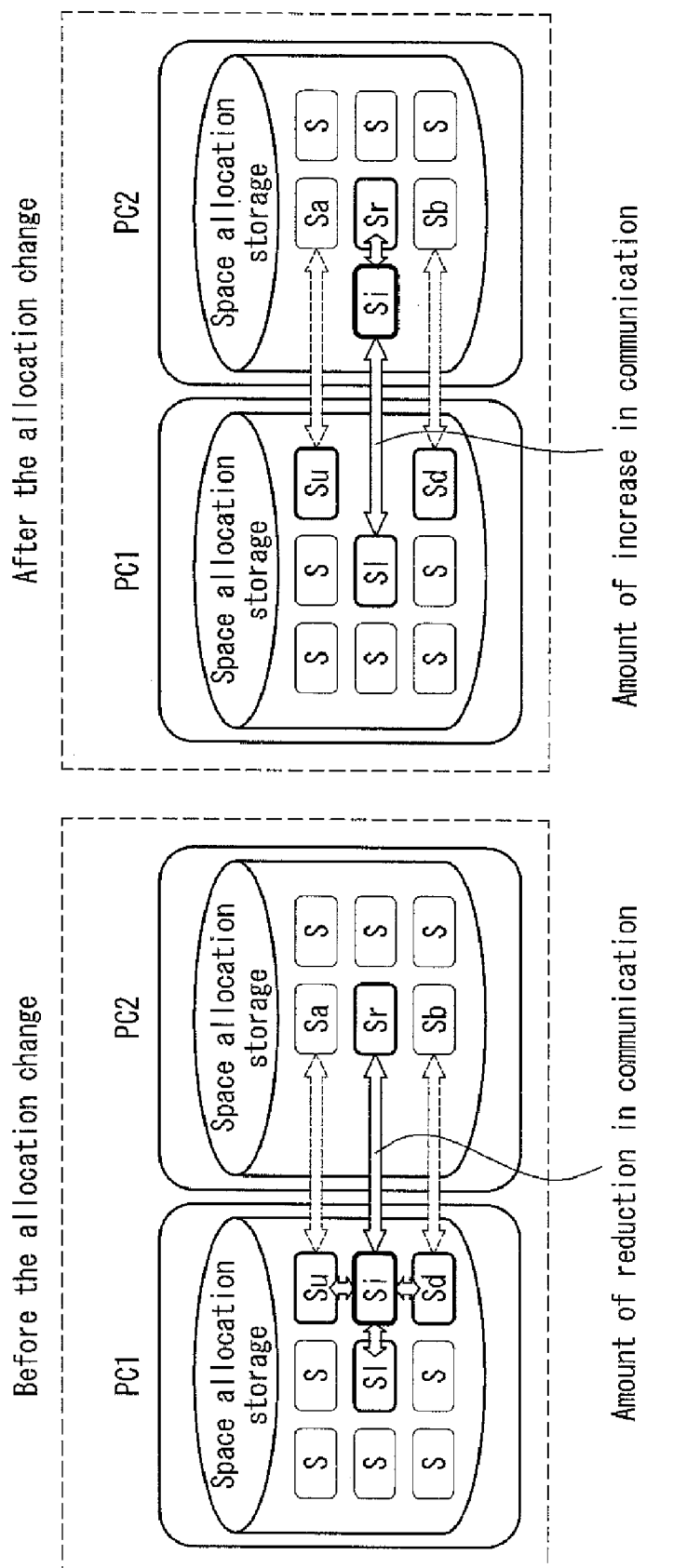
FIGS. 11A and 11B schematically illustrate communication states before and after the allocation of the allocation change candidate space is changed from the calculator PC 1 to the calculator PC 2.

FIGS. 11A and 11B schematically illustrate communication states before and after the allocation of the allocation change candidate space is changed from the calculator PC 1 to the calculator PC 2. As illustrated in FIG. 11, before and after the allocation change, adjacent spaces Su and Sd of the allocation change candidate space Si in the PC 1 communicate with divided spaces Sa and Sb in the PC 2, respectively. Therefore, even though the allocation change candidate space Si in the PC 1 is moved to the PC 2, the amounts of communication between the divided spaces Su, Sd in the PC 1 and the divided spaces in the PC 2 do not change. That is, even though communication is generated between the allocation change candidate space Si in the PC 2 and the divided spaces Su, Sd in the PC 1 after the movement of the allocation change candidate space Si to the PC 2, the amount of communication between the PC 1 and PC 2 is not increased by this communication.

2-2. Processing Contents of the Simulation Program

Figure 12:
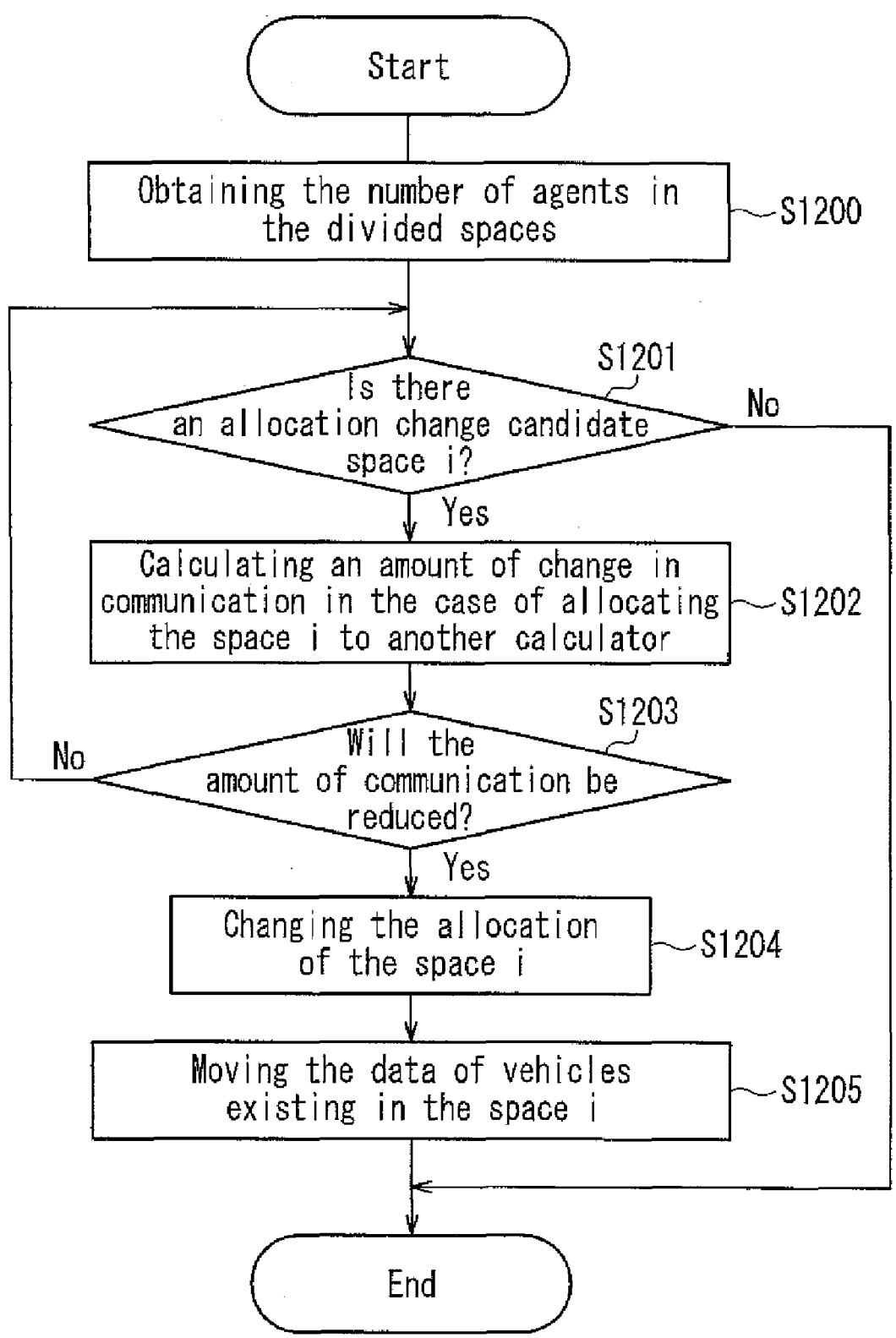
FIG. 12 is an operation chart illustrating exemplary processings based on a simulation program executed in the CPU 23 of the calculator according to the present embodiment.

FIG. 12 exemplifies an operation chart illustrating processings based on a simulation program executed in the CPU 23 of the calculator according to the present embodiment. Further, the plurality of divided spaces allocated to a part of the calculators (PC 1 to PC 3) constituting the traffic flow simulator according to the present embodiment, the space allocation information 26b and the agent information 26c are the same as FIGS. 7 to 9 respectively illustrated in Embodiment 1. In the present embodiment, likewise Embodiment 1, a processing of reducing the amount of communication between the calculators PC 1, PC 2 and PC 3 will be described, as illustrated in FIG. 7.

Processings at operations S1200, S1201 S1204 and S1205 in FIG. 12 are the same as those at operations S600, S601, S605 and S606 respectively described in Embodiment 1. Therefore, operations S1202 and S1203 in FIG. 12 will be described.

The CPU 23 calculates the amount of change in communication in the case of allocating the allocation change candidate space i to another calculator (operation S1202). An example of calculating the amount of communication will be described below. Likewise Embodiment 1, for example, Nx is "the number of vehicles existing in a divided space Sx", Dr is "the amount of data of vehicles (reference)", Du is "Dr× reference frequency per unit time". Incidentally, "reference" used herein refers to communication of information (location, speed, etc) related to vehicle agents existing in the divided spaces allocated to other calculators. This communication is performed between calculators constantly.

As to an amount of change in communication R1 in which the divided space Si is processed by the PC 1, since the allocation of the allocation change candidate space i is not changed, the amount of change in communication R1 is 0.

An amount of change in communication R2 in which the allocation change candidate space i is allocated to another calculator PC 2 and the divided space Si is processed by the PC 2 can be calculated by the following formula:

$$R2 = (+Nl - Nr) \times Du$$

Further, an amount of change in communication R3 in which the allocation change candidate space i is allocated to another calculator PC 3 and the divided space Si is processed by the PC 3 can be calculated by the following formula:

$$R3 = (+Nl - Nd) \times Du$$

For example, in the formulas above, when Ni=20, Nu=1, Nl=1, Nr=10, Nd=5; it is possible to calculate each of R1, R2 and R3 as follows:

$$R1 = 0, R2 = -9 \times Du, R3 = -4 \times Du$$

In this case, since Du is a fixed value, R2 can be judged as the smallest amount of change in communication, and the amount of communication after the allocation change to the PC 2 can be expected to be smaller than the current amount of communication (amount of communication before the allocation change).

On the other hand, when Ni=20, Nu=8, Nl=7, Nr=10, Nd=5; it is possible to calculate each of R1, R2 and R3 as follows:

$$R1 = 0, R2 = -3 \times Du, R3 = +3 \times Du$$

In this case, since Du is a fixed value, R2 can be judged as the smallest amount of change in communication, and the amount of communication after the allocation change to the PC 2 can be expected to be smaller than the current amount of communication (amount of communication before the allocation change).

When judging that the amount of communication after the allocation change becomes smaller than the current amount of communication (amount of communication before the allocation change) (operation S1203, Yes), the CPU 23 changes the allocation of the allocation change candidate space i (operation S1204).

As described above, in the case of calculating the amount of communication to be generated between the adjacent spaces based on the number of vehicles, and judging whether or not the amount of communication is reduced, it is possible to consider substantial change in the amount of communication to be generated between the calculators.

2-3. Modification Example

In the case of allocating the allocation change candidate space i to another calculator, a processing in accordance with the allocation change is required. For example, it is necessary to transmit data of all vehicle agents existing in the allocation change candidate space i to the calculator of the movement destination. Therefore, it is possible to have a configuration in which a processing cost is expressed as a "penalty"; the penalty and the amount of reduction in communication are compared; and when the amount of reduction in communication is greater than the penalty, the allocation is changed. In this case, setting a penalty proportional to the number of vehicles is appropriate.

Thus, it is possible to prevent the amount of communication from being increased by contraries due to the shift, in accordance with the allocation change, of the vehicle data in the allocation change candidate space, whereby the amount of communication by the allocation change can be reduced effectively.

Figure 13:
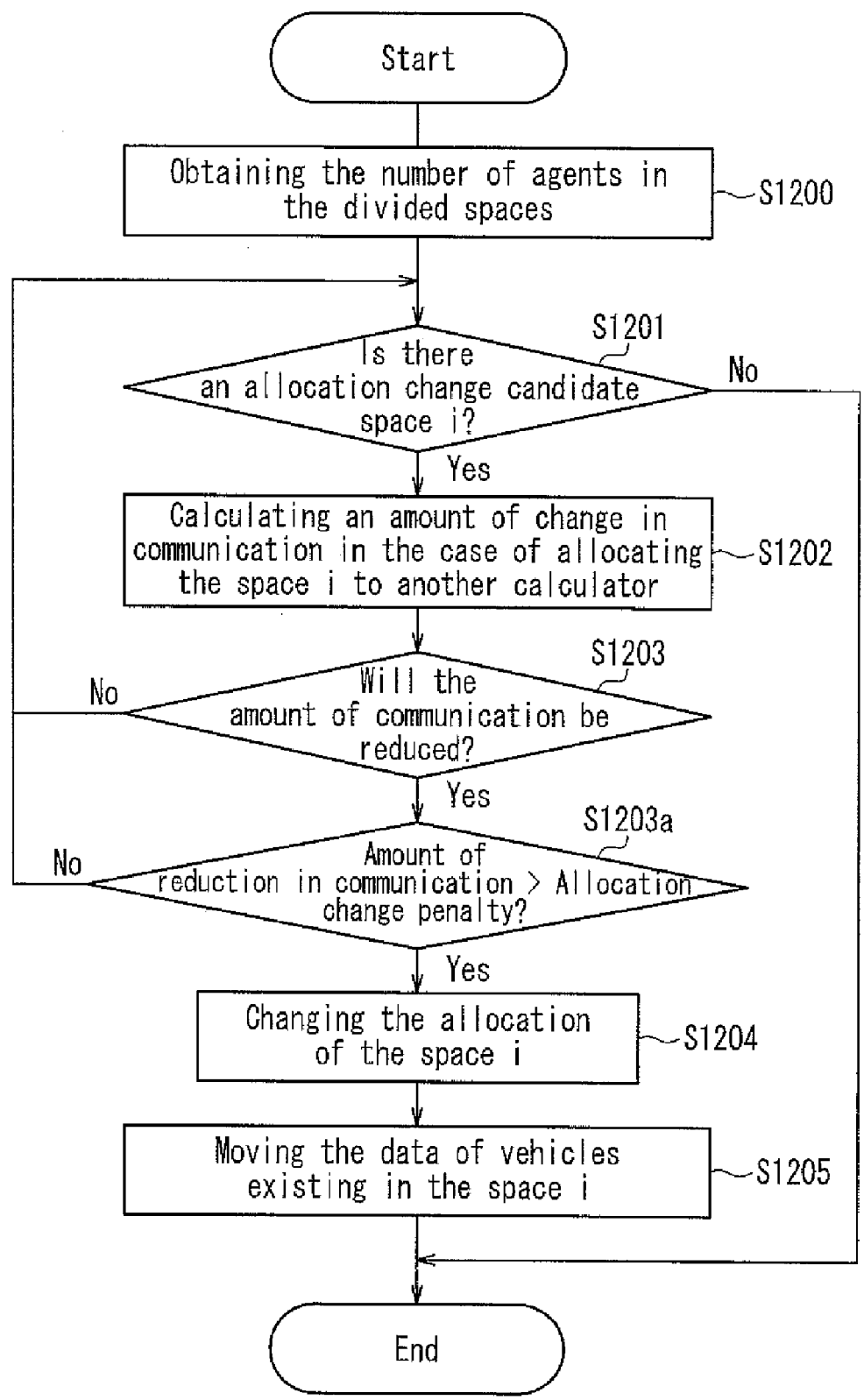
FIG. 13 is an operation chart illustrating exemplary processings based on a simulation program executed in the CPU 23 of the calculator according to a modification example of the present embodiment.

FIG. 13 exemplifies an operation chart illustrating processings based on a simulation program executed in the CPU 23 of the calculator according to a modification example of the present embodiment.

Processings at operations S1200 to S1203 and S1204 to S1205 in FIG. 13 are the same as those respectively described in FIG. 12. In FIG. 13, an operation S1203a is executed, following the operation S1203. In S1203a, in the case where the allocation change candidate space i is moved to the calculator that reduces the amount of communication most from among the amounts of change in communication calculated, and if the amount of reduction in communication becomes greater than a predetermined allocation change penalty S1204 is executed for changing the space allocation. An example of calculating an allocation change penalty will be described below. For example, Px is "penalty in the case of changing the allocation to the space Sx", Nx is "the number of vehicles existing in a space Sx", and A is "proportionality". Incidentally, Nx may be a value based on the amount of data in accordance with the movement of vehicles, a load state of communication lines, processing ability of calculators or the like, in addition to the number of vehicles. The movement penalty calculation coefficient 1004 input to the control screen 1000 illustrated in FIG. 10 is used as A.

As to a penalty P1 in which the divided space Si is processed by the PC 1, since the allocation of the allocation change candidate space i is not changed, the penalty P1 is 0.

A penalty P2 in which the allocation change candidate space i is allocated to another calculator PC 2 and the divided space Si is processed by the PC 2 can be calculated by the following formula:

$$P2=Ni \times A$$

Further, a penalty P3 in which the allocation change candidate space i is allocated to another calculator PC 3 and the divided space Si is processed by the PC 3 can be calculated by the following formula:

$$P3=Ni \times A$$

When judging that the amount of communication after the allocation change becomes smaller than the current amount of communication (amount of communication before the allocation change) even considering the penalty (operation S1203a, Yes), the CPU 23 changes the allocation of the allocation change candidate space i (operation S1204).

Therefore, it is possible to prevent the amount of communication from being increased by contraries due to the shift, in accordance with the allocation change, of the vehicle data in the allocation change candidate space, whereby the amount of communication by the allocation change can be reduced effectively.

3. Embodiment 3

In a calculator of a simulator according to the present embodiment, the space allocation is changed only when the processing load of the calculator resource of the allocation change destination is within an allowable range. Because of this, the space allocation changing part of the calculator resource of the allocation change base asks the calculator resource of the allocation change destination whether or not to accept the allocation change. In the traffic flow simulator, it is considered that the processing load substantially is proportional to the number of vehicles targeted for the simulation, and therefore, the calculator of the allocation change destination may be set to accept the allocation change when the number of vehicles does not exceed an upper limit value.

The calculator of the simulator according to the present embodiment calculates and monitors its own processing load. The calculator, when the calculated processing load is equal to or less than a predetermined threshold, accepts a request for the space allocation change from another calculator. Specifically, the calculator calculates its own processing load based on the number of agents existing in the divided spaces allocated to itself. Thus, it is possible to prevent a situation that the processing required for the allocation change of the allocation change candidate space is concentrated on a particular calculator and the processing load of the calculator exceeds the allowable range.

3-1. Outline of the Processing

The followings are the same as FIGS. 1 to 4 respectively described in Embodiment 1; a configuration of a distributed processing-type simulator according to the present embodiment; a schematic diagram illustrating a case in which predetermined areas in the virtual space are allocated to respective calculators of the present embodiment, so as to simulate the behavior of a plurality of agents; a schematic diagram illustrating a relationship between vehicle agents and a road map in a predetermined area of the present embodiment; and a hardware configuration in which the calculator of the present embodiment is realized using a CPU.

Figure 14:
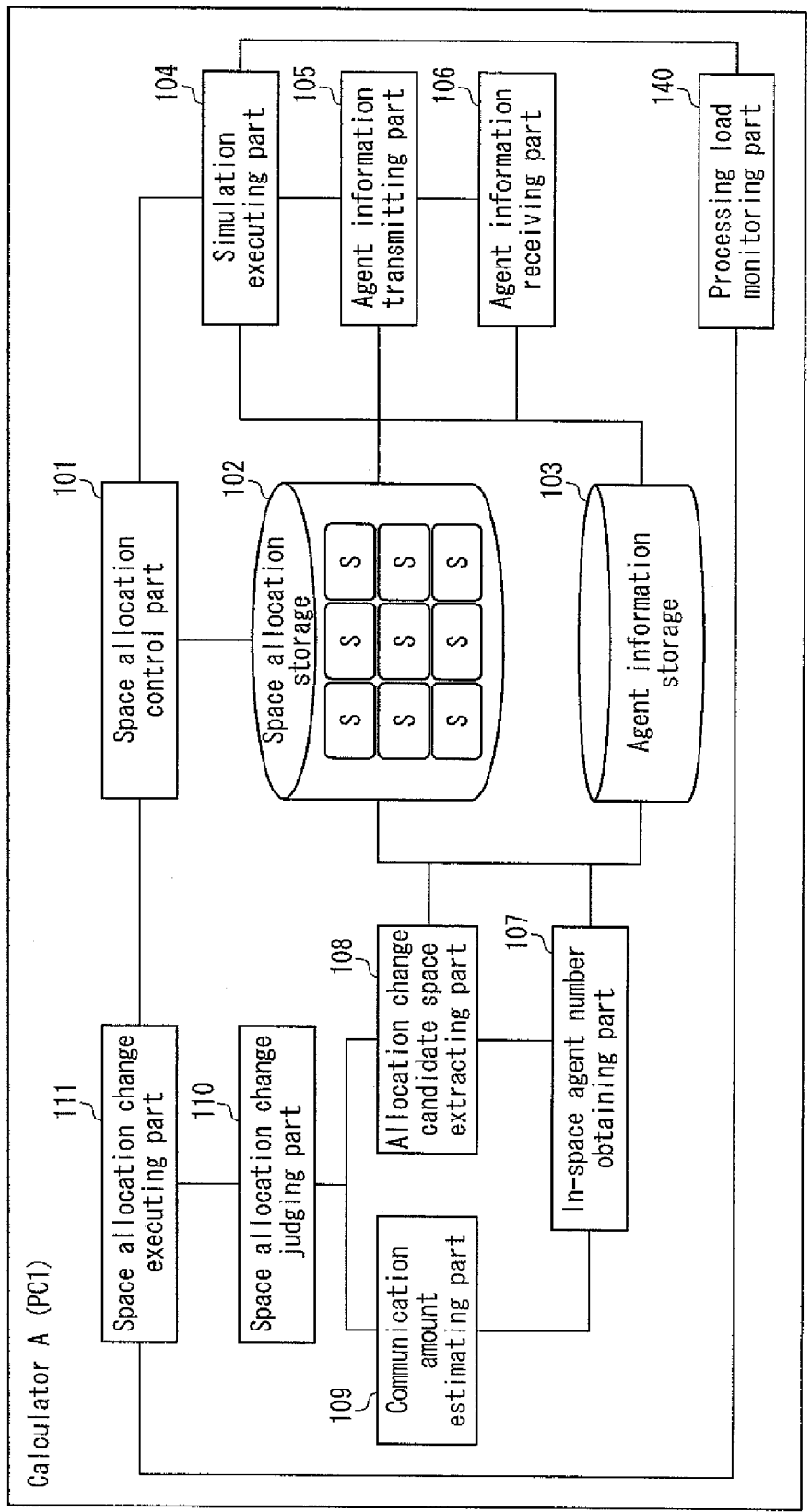
FIG. 14 exemplifies a functional block diagram illustrating a configuration example of a calculator A illustrated in FIG. 1.

FIG. 14 exemplifies a functional block diagram of a calculator A constituting the distributed processing-type simulator according to the present embodiment. In the configuration of FIG. 14, a processing load monitoring part 140 is further added to the functional parts of the calculator A illustrated in FIG. 3.

In the present embodiment, likewise Embodiment 1, an example of performing the distributed processing using the calculator A (PC 1), calculator B (PC 2) and calculator C (PC 3) will be described. An initial allocation state of the divided spaces targeted for the simulation is the same as that of Embodiment 1.

Figure 15:
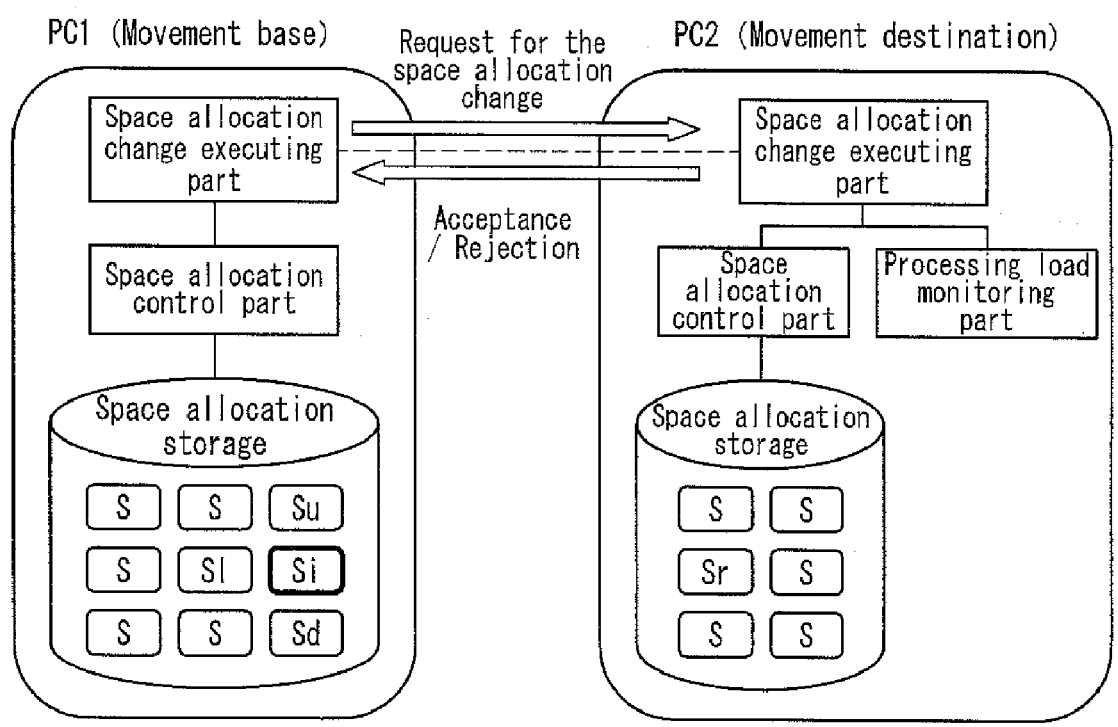
FIG. 15 schematically illustrates an exemplary case of requesting the allocation change of the allocation change candidate space from the calculator PC 1 (movement base) to the calculator PC 2 (movement destination).

FIG. 15 schematically illustrates the case of requesting the allocation change of the allocation change candidate space from the calculator PC 1 (movement base) to the calculator PC 2 (movement destination). The space allocation change executing part of the PC 1, when it judges that the total amount of communication will be reduced if the allocation change candidate space Si is moved to the PC 2 by the allocation change, requests the space allocation change to the PC 2.

After receiving the request for the space allocation change from the PC 1, the space allocation change executing part of the PC 2 obtains information of the processing load from the processing load monitoring part that monitors the processing load arbitrarily in the PC 2, and accepts the request for the space allocation change from the PC 1 when the processing load is equal to or less than a predetermined threshold. In this case, the space allocation control parts of the PC 1 and PC 2 update the space allocation storages so that the allocation change candidate space Si is processed by the PC 2. Meanwhile, when the processing load exceeds the predetermined threshold, the space allocation change executing part of the PC 2 rejects the request for the space allocation change from the PC 1. In the case, the allocation of the allocation change candidate space Si is not changed.

3-2. Processing Contents of the Simulation Program

Figure 16:
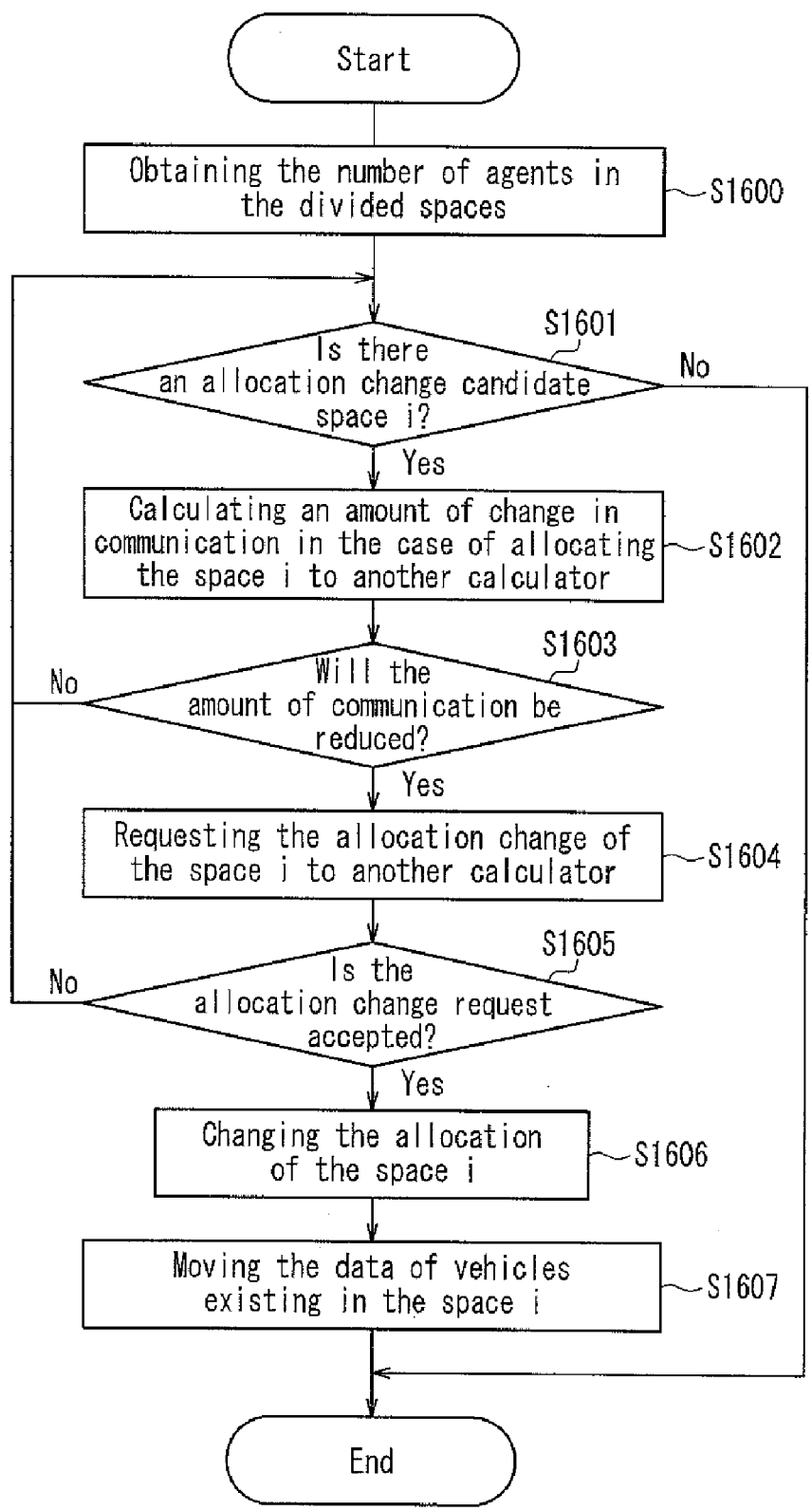
FIG. 16 is an operation chart illustrating exemplary processings based on a simulation program executed in the CPU 23 of the movement base calculator (for example, PC 1).
Figure 17:
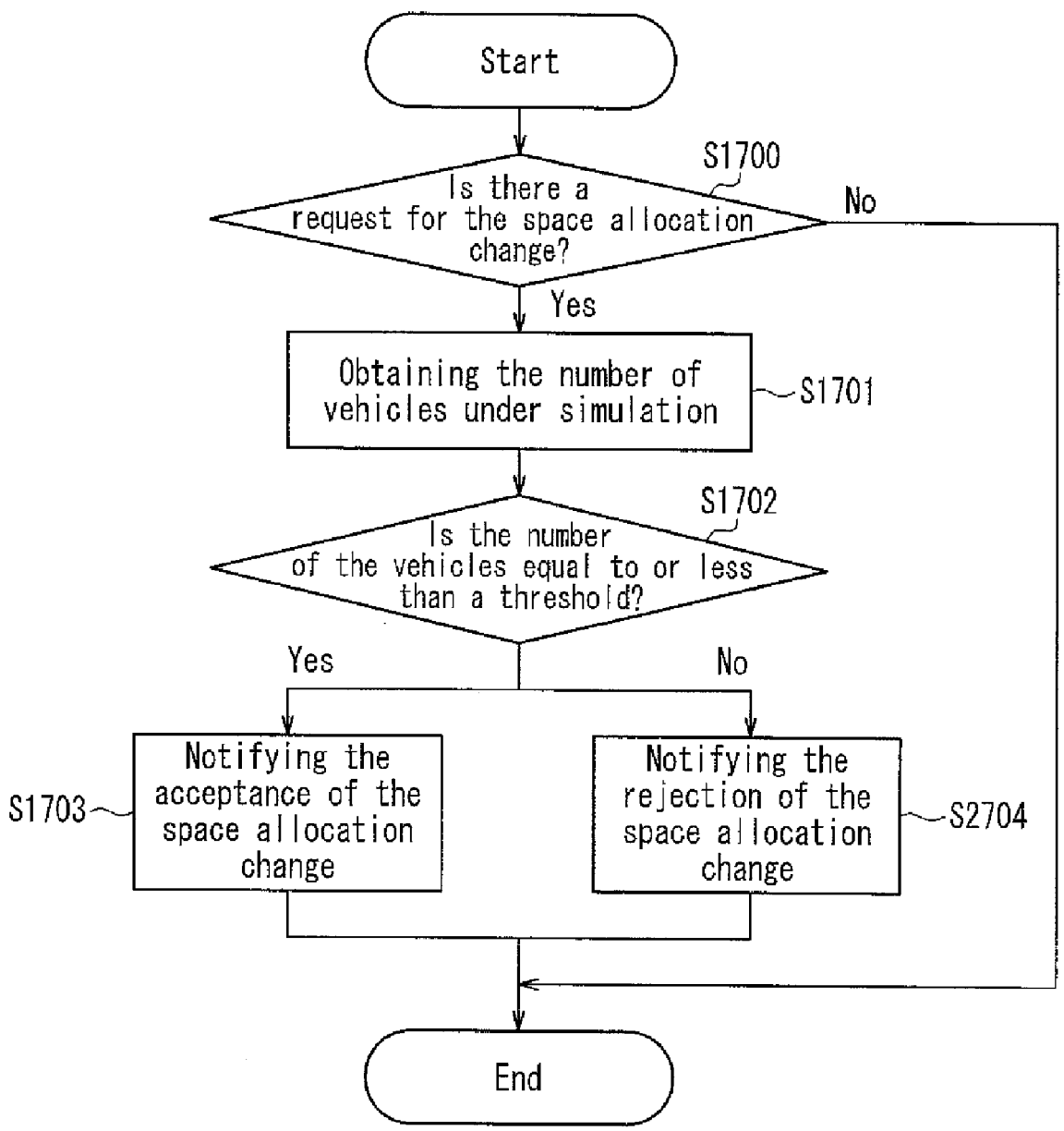
FIG. 17 is an operation chart illustrating exemplary processings based on a simulation program executed in the CPU 23 of the calculator to be a candidate for the movement destination (for example, PC 2).

FIG. 16 exemplifies an operation chart illustrating processings based on a simulation program executed in the CPU 23 of the movement base calculator (for example, PC 1). FIG. 17 exemplifies an operation chart illustrating processings based on a simulation program executed in the CPU 23 of the calculator to be a candidate for the movement destination (for example, PC 2). Further, the plurality of divided spaces allocated to a part of the calculators (PC 1 to PC 3) constituting the traffic flow simulator according to the present embodiment, the space allocation information 26b and the agent information 26c are the same as FIGS. 7 to 9 respectively illustrated in Embodiment 1. In the present embodiment, likewise Embodiment 2, a processing of reducing the amount of communication between the calculators PC 1, PC 2 and PC 3 will be described as illustrated in FIG. 7.

Processings at operations S1600 to S1603, S1606 and S1607 in FIG. 16 are the same as those at operations S1200 to S1205 respectively described in Embodiment 2. Therefore, operations S1604 and S1605 in FIG. 16 will be described.

The CPU 23 calculates the amount of change in communication in the case of allocating the allocation change candidate space i to another calculator (operation S1602). When determining another calculator to be allocated with the allocation change candidate space i (operation S1603, Yes), the CPU 23 requests the allocation change of the allocation change candidate space i to the determined calculator (operation S1604).

For example, the CPU 23 of the PC 1, when it judges that the total amount of communication can be reduced if the allocation change candidate space Si allocated to itself is moved to the PC 2, requests the allocation change to the PC 2. After receiving the request for the allocation change, the simulation program of the PC 2 notifies an acceptance or rejection of the space allocation change to the PC 1, in accordance with the operation chart in FIG. 17.

Specifically, when receiving the request for the space allocation change (operation S1700, Yes), the CPU 23 of the PC 2 obtains the number of vehicles under simulation in the PC 2 (operation S1701). For example, the CPU 23 refers to the space allocation information 26b (FIG. 8) and the agent information 26c (FIG. 9) in the hard disk 26, and obtains the number of all vehicle agents existing in each divided space allocated to the PC 2. Then, when the number of the vehicles is equal to or less than the threshold (operation S1702, Yes), the CPU 23 of the PC 2 notifies the acceptance of the space allocation change. Meanwhile, when the number of the vehicles exceeds the threshold (operation S1702, No), the CPU 23 of the PC 2 notifies the rejection of the space allocation change.

After receiving the notification of the acceptance or rejection of the space allocation change from the PC 2, and if the request for the allocation change is accepted, the CPU 23 of the PC 1 moves the data of the vehicle agents existing in the allocation change candidate space Si to the PC 2 (operation S1607).

Incidentally, in the above-described operation S1702, the CPU 23 of the PC 2 uses, as an exemplary processing load, the number of vehicles to determine the acceptance or rejection of the request for the allocation change, but the criterion for judging the processing load is not limited thereto. Alternatively, the acceptance or rejection may be judged based on a CPU use ratio or a memory use ratio.

As described above, it is possible to prevent a situation that the processing required for the allocation change of the allocation change candidate space is concentrated on a particular calculator and the processing load of the calculator exceeds the allowable range.

The "processing load monitoring part" illustrated in the functional block diagram in FIG. 14 includes, as an example, a processing function at the operation S1701 in FIG. 17.

4. Embodiment 4

A calculator of the simulator according to the present embodiment calculates the amount of communication after the allocation change, further considering an amount of communication to be generated when an agent existing in the allocation change candidate space moves to a divided space allocated to the calculator targeted for the allocation. Specifically, based on the number of agents having moved in a past fixed time, the amount of communication is calculated that is to be generated when agents move to the divided space allocated to the calculator targeted for the allocation. Thus, by considering the amount of communication to be generated when agents move across the divided spaces, the space allocation can be changed effectively to reduce the amount of communication. Further, by considering the number of agents having moved in the past fixed time, the number of occurrence of the movement between spaces in a future fixed time can be predicted to judge the space allocation change.

4-1. Outline of the Processing

The followings are the same as FIGS. 1 to 4 respectively described in Embodiment 1; a configuration of a distributed processing-type simulator according to the present embodiment; a schematic diagram illustrating a case in which predetermined areas in the virtual space are allocated to respective calculators of the present embodiment, so as to simulate the behavior of a plurality of agents; a schematic diagram illustrating a relationship between vehicle agents and a road map in a predetermined area of the present embodiment; a functional block diagram illustrating a configuration example of a calculator of the present embodiment; and a hardware configuration in which the calculator is realized using a CPU. In the present embodiment, likewise Embodiment 1, an example of performing distributed processing using a calculator A (PC 1), calculator B (PC 2) and calculator C (PC 3) will be described. An initial allocation state of the divided spaces targeted for the simulation is the same as that of Embodiment 1.

Figure 18:
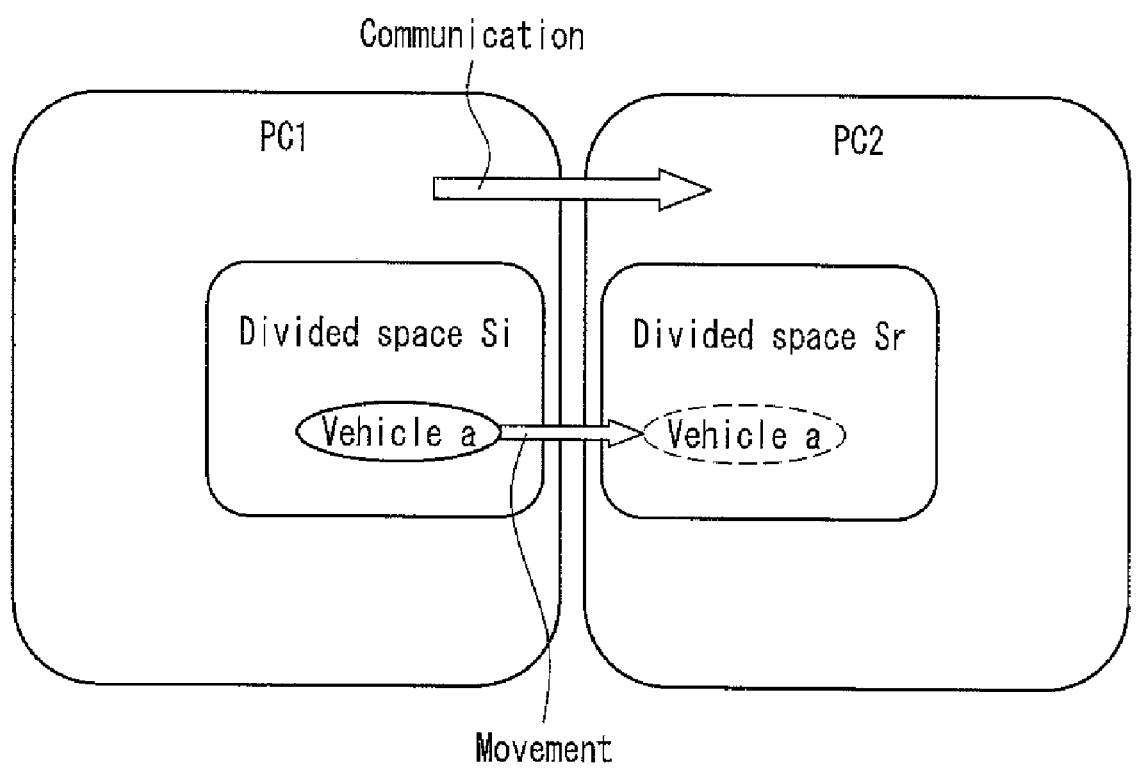
FIG. 18 schematically illustrates an exemplary state in which the allocation of the allocation change candidate space is changed from the calculator PC 1 to the calculator PC 2.

FIG. 18 schematically illustrates a state in which a vehicle moves from a divided space allocated to the calculator PC 1 to a divided space allocated to the calculator PC 2. In the traffic flow simulator, since a vehicle "a" moves across a boundary of these divided spaces (movement between spaces), a space where the vehicle a exists is changed from the divided space Si to the divided space Sr in accordance with this movement. Therefore, in the case where the movement destination, i.e., divided space Sr, is allocated to another calculator resource, i.e., PC 2, communication is generated (generation of communication because of the movement between spaces). This communication allows the PC2 to store agent information that is required for simulating the vehicle a in the PC2.

Since the data size of the vehicle agent information to be transmitted/received at the time of the movement across the boundary of spaces is fixed, the amount of communication to be generated is proportional to the frequency of occurrence of the movement between spaces. Therefore, a processing of estimating the frequency of occurrence of the movement between spaces is added to the above configuration, and the communication amount estimating part, when it estimates the amount of communication after the allocation change, adds/subtracts the amount of communication expected to be generated during movement between spaces to/from the estimation. Incidentally, based on the number of vehicles or the like having moved in the past fixed time, it is possible to calculate the number of occurrence of the movement between spaces per unit time.

4-2. Processing Contents of the Simulation Program

The plurality of divided spaces allocated to a part of the calculators (PC 1 to PC 3) constituting the traffic flow simulator according to the present embodiment, the space allocation information 26b and the agent information 26c are the same as FIGS. 7 to 9 respectively illustrated in Embodiment 1. In the present embodiment, likewise Embodiment 1, a processing of reducing the amount of communication between the calculators PC 1, PC 2 and PC 3 will be described as illustrated in FIG. 7.

A simulation program executed in the CPU 23 of the calculator according to the present embodiment basically is the same as FIG. 6 illustrated in Embodiment 1. However, specific processing contents at operations S602 and S603 in the operation chart are different from those in Embodiment 1, so that the operations S602 and S603 of FIG. 6 will be described.

The CPU 23 calculates the current amount of communication between the allocation change candidate space i and its adjacent spaces (operation S602). An example of calculating the amount of communication will be described below. For example, likewise Embodiment 1, Nx is "the number of vehicles existing in a divided space Sx", Dr is "the amount of data of vehicles (reference)", Du is "Dr×reference frequency per unit time". Further, in the present embodiment, Dm is "the amount of data of vehicles at the time of the movement", T[x, y] is "expected value of the number of vehicles moved between a space x and a space y per unit time", Dt[x, y] is "Dm×T[x, y]". Incidentally, the "reference" used herein refers to communication of information (location, speed, etc) related to vehicle agents existing in the divided spaces allocated to other calculators. This communication is performed between calculators constantly. Meanwhile, when the allocation change candidate space i is moved to a divided space allocated to another calculator, all the agent information is communicated so that the simulation is continued by the calculator of the movement destination.

The expected value in the "expected value of the number of vehicles moved between a space x and a space y per unit time" indicated by T[x, y] is a value based on the number of agents moved in the past fixed time. For example, the expected value may be calculated based on the number of the movement in the past one hour. Incidentally, the expected value may be determined based on conditions of roads where the vehicle agents move (road size, the number of lanes, highway or not, with or without signals, etc.).

As to the current amount of communication, an amount of communication D1 in which the divided space Si is processed by the PC 1 can be calculated by the following formula:

$$D1=(Ni\times2+Nr+Nd)\times Du+Dt[i,r]+Dt[i,d]$$

The CPU 23 calculates an amount of communication between the allocation change candidate space i and its adjacent spaces in the case of allocating the allocation change candidate space i to another calculator (operation S603).

An amount of communication D2 in which the allocation change candidate space i currently in the PC 1 is allocated to another calculator PC 2 and the divided space Si is processed by the PC 2 can be calculated by the following formula:

$$D2=(Ni\times2+Nu+Nl+Nd)\times Du+Dt[i,u]+Dt[i,l]+Dt[i,d]$$

Similarly, an amount of communication D3 in which the allocation change candidate space i is allocated to another calculator PC 3 and the divided space Si is processed by the PC 3 can be calculated by the following formula:

$$D3=(Ni\times2+Nu+Nl+Nr)\times Du+Dt[i,u]+Dt[i,r]+Dt[i,l]$$

Likewise Embodiment 1, the CPU 23 judges whether or not the amount of communication after the allocation change becomes smaller than the current amount of communication (amount of communication before the allocation change) (operation S604), and changes the allocation of the allocation change candidate space i when judging that the amount of communication after the allocation change may become smaller than the current amount of communication (amount of communication before the allocation change) (operation S605).

Thus, by considering the amount of communication to be generated when agents move across the divided spaces, the space allocation can be changed effectively to reduce the amount of communication. Further, by considering the number of agents having moved in the past fixed time, the number of occurrence of the movement between spaces in a future fixed time can be predicted to judge the space allocation change.

5. Other Embodiments

5-1. Change of Two or More Allocation Change Candidate Spaces

Although it depends on the number of vehicles existing in the adjacent spaces, there is a case where the amount of communication increases when the allocation of one divided space is changed, but decreases when the allocation of two or more divided spaces is changed simultaneously. Therefore, the space allocation changing part may determine the space for the allocation change by also comparing an amount of communication to be generated when two or more allocation change candidate spaces are changed simultaneously.

5-2. Storage of the Space Allocation

Further, the traffic state has reproducibility per hour and per day of the week. For example, traffics become busy at the same time and same day of the week. Therefore, the space allocation may be recorded for reuse. A processing of storing the space allocation for reading in the allocation in accordance with the simulation time may be added to the above configuration. In this case, the amount of communication can be kept low from the start of the simulation.

5-3. Combination of the Embodiments

The distributed processing-type simulator of the present application may combine two or more of parts or entities of the configurations illustrated in the above Embodiments 1 to 4.

5-4. Method of Realizing Each Functional Block

In the aforementioned embodiments, each functional block illustrated in FIG. 3 is realized by the CPU processing that executes software. However, all or some of the functional blocks may be realized by hardware, such as a logic circuit. Incidentally, a part of the program may be processed by the operating system (OS).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A simulator that simulates behaviors of a plurality of agents existing in a virtual space by distributed processing that uses a plurality of calculators communicable with one another, wherein at least two of the calculators are accessible to a space allocation storage that stores, as space allocation information, a division range of each of divided spaces in the virtual space, and a calculator to which processing related to an agent existing in each of the divided spaces is allocated, at least two of the calculators comprising:

an allocation change candidate space extracting part that refers to the space allocation storage so as to extract, as an allocation change candidate space, a divided space to be a candidate for an allocation change from among divided spaces whose one or more adjacent spaces are allocated to another of the calculators;

a communication amount estimating part that calculates an amount of communication or an amount of change in communication to be generated between the calculator targeted for the allocation and another of the calculators when the allocation change candidate space is allocated to a calculator targeted for the allocation, based on the number of agents existing in the allocation change candidate space and an adjacent divided space thereof; and a space allocation change judging part that determines whether or not to allocate the allocation change candidate space to the calculator targeted for the allocation, based on the amount of communication or the amount of change in communication calculated in the communication amount estimating part.

2. The simulator according to claim 1, wherein at least two of the calculators further include:

a space allocation control part that updates the space allocation information stored in the space allocation storage; and a space allocation change executing part that requests the space allocation control part and the space allocation control part of the calculator targeted for the allocation to update the space allocation information in accordance with the determination of the space allocation change judging part.

3. The simulator according to claim 1, wherein the communication amount estimating part calculates, as an amount of communication before the allocation change, an amount of communication currently being generated between the allocation change candidate space and a divided space in another of the calculators, and also calculates, as an amount of communication after the allocation change, an amount of communication expected to be generated between the allocation change candidate space and a divided space in a calculator other than the calculator targeted for the allocation when the allocation change candidate space is allocated to the calculator targeted for the allocation, and the space allocation change judging part determines to allocate the allocation change candidate space to the calculator targeted for the allocation when the amount of communication after the allocation change is smaller than the amount of communication before the allocation change.

4. The simulator according to claim 1, wherein the communication amount estimating part calculates the amount of change in communication to be generated between the calculator targeted for the allocation and another of the calculators, considering an amount of communication currently being generated between an adjacent space that is adjacent to the allocation change candidate space and allocated to the calculator thereof, and a divided space in the calculator targeted for the allocation, and the space allocation change judging part determines whether or not to allocate the allocation change candidate space to the calculator targeted for the allocation, based on the amount of change in communication that reduces the amount of communication most.

5. The simulator according to claim 1, wherein the space allocation change judging part determines whether or not to allocate the allocation change candidate space to the calculator targeted for the allocation, considering a penalty based on the number of agents to be generated when agent information related to an agent existing in the allocation change candidate space is moved to the calculator targeted for the allocation.

6. The simulator according to claim 2, wherein at least two of the calculators further includes a processing load monitoring part that calculates and monitors processing load thereof, and the space allocation change executing part accepts a request for the space allocation change from another of the calculators when the processing load obtained from the processing load monitoring part is equal to or less than a predetermined threshold.

7. The simulator according to claim 6, wherein the processing load monitoring part calculates processing load of the calculator thereof based on the number of agents existing in at least a divided space allocated to the calculator thereof.

8. The simulator according to claim 3, wherein the communication amount estimating part calculates the amount of communication after the allocation change, further considering an amount of communication to be generated when an agent existing in the allocation change candidate space moves to a divided space allocated to the calculator targeted for the allocation.

9. The simulator according to claim 8, wherein the communication amount estimating part calculates an amount of communication to be generated when the agent existing in the allocation change candidate space moves to a divided space allocated to the calculator targeted for the allocation, based on the number of the agents having moved in a past fixed time.

10. A calculator used for a simulation in which behaviors of a plurality of agents existing in a virtual space are simulated by distributed processing that uses a plurality of calculators communicable with one another, comprising:

a space allocation storage that stores, as space allocation information, a division range of each of divided spaces in the virtual space, and a calculator to which processing related to an agent existing in each of the divided spaces is allocated;

an allocation change candidate space extracting part that refers to the space allocation storage so as to extract, as an allocation change candidate space, a divided space to be a candidate for an allocation change from among divided spaces whose one or more adjacent spaces are allocated to another of the calculators;

a communication amount estimating part that calculates an amount of communication or an amount of change in communication to be generated between the calculator targeted for the allocation and another of the calculators when the allocation change candidate space is allocated to a calculator targeted for the allocation, based on the number of agents existing in the allocation change candidate space and an adjacent divided space thereof; and a space allocation change judging part that determines whether or not to allocate the allocation change candidate space to the calculator targeted for the allocation, based on the amount of communication or the amount of change in communication calculated in the communication amount estimating part.

11. A recording medium storing a simulation program using a computer for a simulator in which behaviors of a plurality of agents existing in a virtual space are simulated by distributed processing that uses a plurality of calculators communicable with one another, the simulation program causing the computer of at least two of the calculators to execute:

processing of accessing a space allocation storage that stores, as space allocation information, a division range of each of divided spaces in the virtual space, and a calculator to which processing related to an agent existing in each of the divided spaces is allocated;

allocation change candidate space extracting processing of extracting, as an allocation change candidate space, a divided space to be a candidate for an allocation change from among divided spaces whose one or more adjacent spaces are allocated to another of the calculators, by referring to the space allocation storage;

communication amount estimating processing of calculating an amount of communication or an amount of change in communication to be generated between the calculator targeted for the allocation and another of the calculators when the allocation change candidate space is allocated to a calculator targeted for the allocation, based on the number of agents existing in the allocation change candidate space and an adjacent divided space thereof; and space allocation change judging processing of determining whether or not to allocate the allocation change candidate space to the calculator targeted for the allocation, based on the amount of communication or the amount of change in communication calculated in the communication amount estimating processing.

* * * * *